(12) United States Patent
Takeuchi et al.

(10) Patent No.: US 10,359,594 B2
(45) Date of Patent: Jul. 23, 2019

(54) APPARATUS FOR CABLE ROUTING

(71) Applicant: Go!Foton Holdings, Inc., Somerset, NJ (US)

(72) Inventors: Kenichiro Takeuchi, North Brunswick, NJ (US); Haiguang Lu, Los Altos, CA (US); Alla Shtabnaya, Hillsborough, NJ (US)

(73) Assignee: Go!Foton Holdings, Inc., Somerset, NJ (US)

( * ) Notice: Subject to any disclaimer, the term of this patent is extended or adjusted under 35 U.S.C. 154(b) by 0 days.

(21) Appl. No.: 15/707,006

(22) Filed: Sep. 18, 2017

(65) Prior Publication Data

US 2018/0003913 A1 Jan. 4, 2018

Related U.S. Application Data

(63) Continuation of application No. 15/270,234, filed on Sep. 20, 2016, now Pat. No. 9,851,231.
(Continued)

(51) Int. Cl.
*G02B 6/38* (2006.01)
*G02B 6/44* (2006.01)
(Continued)

(52) U.S. Cl.
CPC .......... *G02B 6/4452* (2013.01); *G02B 6/3897* (2013.01); *G02B 6/4455* (2013.01);
(Continued)

(58) Field of Classification Search
CPC .. G02B 6/3897; G02B 6/4452; G02B 6/4454; G02B 6/4455; G02B 6/4457;
(Continued)

(56) References Cited

U.S. PATENT DOCUMENTS 3,335,326 A 8/1967 Bonin et al.
4,097,683 A 6/1978 Summers
(Continued)

FOREIGN PATENT DOCUMENTS

CN 1513093 A 7/2004
CN 102089692 A 6/2011
EP 1160603 A1 12/2001

OTHER PUBLICATIONS

Extended European Search Report and Written Opinion for EP Application No. 16849466.4, dated Apr. 11, 2019.

*Primary Examiner* — Michael P Mooney
(74) *Attorney, Agent, or Firm* — Lerner, David, Littenberg, Krumholz & Mentlik, LLP

(57) ABSTRACT

A communication system includes an outer housing, an inner housing, and a hanger plate assembly. The outer housing has first and second side walls. The inner housing is at least partially positioned within the outer housing. The inner housing has first and second side walls and is configured to receive a plurality of patch panel devices therein in a stacked arrangement. The hanger plate assembly includes a first hanger plate hingedly coupled to the first side wall of the inner housing and a plurality of hangers connected to the first hanger plate in a stacked arrangement. Each hanger is adapted to support a cable thereon. The hanger plate assembly has a stored condition in which the hanger plate assembly is fully positioned within the outer housing, and a pulled out condition in which the hanger plate assembly is at least partially positioned outside the outer housing.

23 Claims, 29 Drawing Sheets

Related U.S. Application Data

(60) Provisional application No. 62/221,897, filed on Sep. 22, 2015.

(51) Int. Cl.
  *H02B 1/00* (2006.01)
  *H05K 7/16* (2006.01)
  *H05K 7/14* (2006.01)

(52) U.S. Cl.
  CPC ............. *G02B 6/4478* (2013.01); *H02B 1/00* (2013.01); *H05K 7/14* (2013.01); *H05K 7/16* (2013.01)

(58) Field of Classification Search
  CPC .......... G02B 6/4478; H02B 1/00; H05K 7/14; H05K 7/16
  USPC .................................................. 385/135–139
  See application file for complete search history.

(56) References Cited

U.S. PATENT DOCUMENTS

| | | | |
|---|---|---|---|
| 4,183,601 A | 1/1980 | Barber et al. | |
| 4,243,834 A | 1/1981 | Logioco | |
| 4,541,209 A | 9/1985 | Hoag | |
| 4,709,980 A | 12/1987 | Coll et al. | |
| 4,722,585 A | 2/1988 | Boyer | |
| 4,776,138 A | 10/1988 | Sumner et al. | |
| 4,984,982 A | 1/1991 | Brownlie et al. | |
| 5,049,700 A | 9/1991 | Kobayashi et al. | |
| 5,069,516 A | 12/1991 | Kohy et al. | |
| 5,122,069 A | 6/1992 | Brownlie et al. | |
| 5,133,038 A | 7/1992 | Zipper | |
| 5,189,723 A | 2/1993 | Johnson et al. | |
| 5,267,122 A | 11/1993 | Glover et al. | |
| 5,389,737 A | 2/1995 | Kobayashi et al. | |
| 5,401,902 A | 3/1995 | Middlebrook et al. | |
| 5,402,515 A * | 3/1995 | Vidacovich .......... | G02B 6/4452 385/135 |
| 5,446,823 A | 8/1995 | Bingham et al. | |
| 5,473,717 A | 12/1995 | Baptiste et al. | |
| 5,499,887 A | 3/1996 | Verra | |
| 5,548,678 A | 8/1996 | Frost et al. | |
| 5,556,060 A | 9/1996 | Bingham et al. | |
| 5,588,076 A | 12/1996 | Peacock et al. | |
| 5,653,559 A | 8/1997 | Stieb et al. | |
| 5,657,412 A | 8/1997 | Caudrelier | |
| 5,684,911 A | 11/1997 | Burgett | |
| 5,706,384 A | 1/1998 | Peacock et al. | |
| 5,825,963 A | 10/1998 | Burgett | |
| 5,896,478 A | 4/1999 | Dauber et al. | |
| 5,939,669 A | 8/1999 | Finzel et al. | |
| 6,085,013 A | 7/2000 | Yatsu | |
| 6,130,982 A | 10/2000 | Diermeier et al. | |
| 6,181,861 B1 | 1/2001 | Wenski et al. | |
| 6,426,462 B1 | 7/2002 | Mignon et al. | |
| 6,427,035 B1 | 7/2002 | Mahony | |
| 6,496,641 B1 | 12/2002 | Mahony | |
| 6,522,804 B1 | 2/2003 | Mahony | |
| 6,539,147 B1 | 3/2003 | Mahony | |
| 6,542,652 B1 | 4/2003 | Mahony | |
| 6,614,980 B1 | 9/2003 | Mahony | |
| 6,625,375 B1 | 9/2003 | Mahony | |
| 6,668,127 B1 | 12/2003 | Mahony | |
| 6,802,724 B1 | 10/2004 | Mahony | |
| 6,807,355 B2 | 10/2004 | Dofher | |
| 6,829,424 B1 | 12/2004 | Finzel et al. | |
| 6,869,296 B2 | 3/2005 | Van Leest | |
| 6,920,274 B2 | 7/2005 | Rapp et al. | |
| 6,990,279 B2 | 1/2006 | Vogel et al. | |
| 7,050,683 B2 | 5/2006 | Dofher | |
| 7,120,347 B2 | 10/2006 | Blackwell, Jr. et al. | |
| 7,198,409 B2 | 4/2007 | Smith et al. | |
| 7,218,827 B2 | 5/2007 | Vongseng et al. | |
| 7,233,731 B2 | 6/2007 | Solheid et al. | |
| 7,313,311 B1 | 12/2007 | Benbow | |
| 7,330,625 B2 | 2/2008 | Barth | |
| 7,333,320 B2 | 2/2008 | Standish et al. | |
| 7,333,708 B2 | 2/2008 | Blackwell, Jr. et al. | |
| 7,381,888 B2 | 6/2008 | Burke et al. | |
| 7,385,137 B2 | 6/2008 | Burke et al. | |
| 7,397,997 B2 | 7/2008 | Ferris et al. | |
| 7,433,570 B2 | 10/2008 | Day | |
| 7,483,617 B2 | 1/2009 | Barth | |
| 7,547,051 B2 | 6/2009 | Burke et al. | |
| 7,600,720 B2 | 10/2009 | Vogel et al. | |
| 7,633,742 B2 | 12/2009 | Standish et al. | |
| 7,653,282 B2 | 1/2010 | Blackwell, Jr. et al. | |
| 7,760,984 B2 | 7/2010 | Solheid et al. | |
| 7,809,233 B2 | 10/2010 | Smith et al. | |
| 7,809,234 B2 | 10/2010 | Smith et al. | |
| 7,816,602 B2 | 10/2010 | Landry et al. | |
| 7,844,161 B2 | 11/2010 | Reagan et al. | |
| RE42,258 E | 3/2011 | Thompson et al. | |
| 8,249,411 B2 | 8/2012 | Burke | |
| 8,263,861 B2 | 9/2012 | Landry et al. | |
| 8,542,973 B2 | 9/2013 | Fabrykowski et al. | |
| 8,588,571 B1 | 11/2013 | Lam et al. | |
| 8,705,929 B2 | 4/2014 | Kowalczyk et al. | |
| 8,811,791 B2 | 8/2014 | Solheid et al. | |
| 8,847,070 B2 | 9/2014 | Burke | |
| 8,891,930 B2 | 11/2014 | Anguiano et al. | |
| 8,938,147 B2 | 1/2015 | Krampotich et al. | |
| 8,939,792 B2 | 1/2015 | Takeuchi et al. | |
| 9,122,021 B2 | 9/2015 | Elenbaas et al. | |
| 9,201,206 B2 | 12/2015 | Smith et al. | |
| 9,287,693 B2 | 3/2016 | Burke | |
| 9,557,507 B2 | 1/2017 | Liu et al. | |
| 9,568,699 B2 | 2/2017 | Geens et al. | |
| 9,678,297 B2 | 6/2017 | Dofher | |
| 9,851,523 B2 | 12/2017 | Takeuchi et al. | |
| 2001/0011009 A1 | 8/2001 | Harada et al. | |
| 2003/0000198 A1 | 1/2003 | Hermey et al. | |
| 2003/0123935 A1 | 7/2003 | Dofher | |
| 2004/0063076 A1 | 4/2004 | Van Leest | |
| 2005/0031287 A1 | 2/2005 | Dofher | |
| 2005/0036749 A1 | 2/2005 | Vogel et al. | |
| 2005/0100301 A1 | 5/2005 | Solheid et al. | |
| 2005/0135769 A1 | 6/2005 | Makooi et al. | |
| 2005/0163448 A1 | 7/2005 | Blackwell et al. | |
| 2005/0207711 A1 | 9/2005 | Vo et al. | |
| 2006/0201213 A1 | 9/2006 | Burke et al. | |
| 2006/0204187 A1 | 9/2006 | Dofher | |
| 2006/0231279 A1 | 10/2006 | Burke et al. | |
| 2006/0254794 A1 | 11/2006 | Burke et al. | |
| 2006/0268495 A1 | 11/2006 | Standish et al. | |
| 2006/0278426 A1 | 12/2006 | Barth | |
| 2006/0280420 A1 | 12/2006 | Blackwell et al. | |
| 2007/0122100 A1 | 5/2007 | Day | |
| 2007/0167074 A1 | 7/2007 | Palmer | |
| 2008/0069511 A1 | 3/2008 | Blackwell et al. | |
| 2008/0240665 A1 | 10/2008 | Barth | |
| 2008/0285934 A1 | 11/2008 | Standish et al. | |
| 2009/0175588 A1 | 7/2009 | Brandt et al. | |
| 2009/0257726 A1 | 10/2009 | Redmann et al. | |
| 2009/0263096 A1 | 10/2009 | Solheid et al. | |
| 2010/0027952 A1 | 2/2010 | Ruiz et al. | |
| 2010/0310221 A1 | 12/2010 | Le Dissez | |
| 2011/0116757 A1 | 5/2011 | Vanmeulen et al. | |
| 2011/0262094 A1 | 10/2011 | Burke | |
| 2011/0262096 A1 | 10/2011 | Fabrykowski et al. | |
| 2011/0268404 A1 | 11/2011 | Cote et al. | |
| 2012/0106910 A1 | 5/2012 | Koller | |
| 2013/0044990 A1 | 2/2013 | Dofher | |
| 2013/0089298 A1 | 4/2013 | Holmberg et al. | |
| 2013/0266283 A1 | 10/2013 | Baldassano et al. | |
| 2014/0044400 A1 | 2/2014 | Anguiano et al. | |
| 2014/0117018 A1 | 5/2014 | Burke | |
| 2014/0196380 A1 | 7/2014 | Burke | |
| 2014/0219621 A1 | 8/2014 | Barnette, Jr. et al. | |
| 2014/0248028 A1 | 9/2014 | Campbell et al. | |
| 2014/0354131 A1 | 12/2014 | Takeuchi et al. | |
| 2014/0355217 A1 | 12/2014 | Takeuchi et al. | |

(56) References Cited

U.S. PATENT DOCUMENTS

| | | |
|---|---|---|
| 2014/0357118 A1 | 12/2014 | Takeuchi et al. |
| 2015/0230008 A1 | 8/2015 | Elford et al. |
| 2015/0268434 A1 | 9/2015 | Barnette, Jr. et al. |
| 2016/0033735 A1 | 2/2016 | Liu et al. |
| 2016/0100493 A1 | 4/2016 | Alarcon et al. |
| 2016/0109036 A1 | 4/2016 | Elford et al. |
| 2016/0109678 A1 | 4/2016 | Schwengler et al. |
| 2016/0112779 A1 | 4/2016 | Barnett, Jr. et al. |
| 2016/0341924 A1 | 11/2016 | Park et al. |
| 2017/0082815 A1 | 3/2017 | Takeuchi et al. |
| 2017/0110784 A1 | 4/2017 | Vermes et al. |

\* cited by examiner

APPARATUS FOR CABLE ROUTING

CROSS-REFERENCE TO RELATED APPLICATIONS

This application is a continuation of U.S. patent application Ser. No. 15/270,234, filed on Sep. 20, 2016, which claims the benefit of the filing date of U.S. Provisional Patent Application No. 62/221,897 filed Sep. 22, 2015, the disclosures of which are both hereby incorporated by reference herein.

BACKGROUND OF THE DISCLOSOURE

The present disclosure generally relates to a device and a system for routing and managing cables coupled to communication connectors, adapters, and/or ports. More particularly, the present disclosure relates to cable routing and management systems for patch panel devices.

In communications cabinets and racks, a multitude of cables are interconnected to one another through connectors, e.g., adapters. A cable organization unit typically has a tray or a shelf or a similar platform, which supports the connectors. Examples of cable organization units include patch panels.

A patch panel houses cable connectors and in the majority of cases is rack mounted. The patch panel typically is two-sided; the front of the patch panel provides for connections to relatively short wires or cables, and the rear of the patch panel usually provides for connection to relatively long wires or cables. This setup facilitates the performance of temporary alterations to the front of the patch panel without disturbing the connections in the rear. Sometimes, the cables connected to the front of the patch panel may interconnect different patch panels and may be relatively short or may be part of longer cables. The patch panel facilitates interconnecting, monitoring, and circuit testing of equipment without necessitating costly switching equipment.

Early applications for patch panels were for telephone exchanges, where they are still used albeit in a more automated form. Patch panels are also used extensively in the entertainment industry, e.g., in recording and television studios. They are also used in concert halls to manage connections among equipment, e.g., microphones, speakers, and other electronic equipment. Patch panels are valued for such purposes not only for their convenience and relative cost effectiveness, but also because they make it easier to identify problems such as feedback, ground loops, and static.

Traditional fiber optic cable organization units include fiber optic shelves having a single patch panel or multiple modular panels on the front patching side of the shelf. It is desirable to provide patch panels having increased connector port density, i.e., the number of locations or ports per unit volume of area for providing connections. To this end, smaller sized connectors are increasingly being utilized.

A variety of optical fiber connectors are available, with the Subscriber Connector (SC) and the Lucent Connector (LC) being the most common. The differences among the types of connectors include dimensions and methods of mechanical coupling. For instance, SC connectors use a round 2.5 mm ferrule to hold a single fiber and use a push-on/pull-off mating mechanism. The ferrule of an LC connector is half the size as that of an SC connector, measuring only 1.25 mm. LC connectors use a retaining tab mechanism, which is similar to that found on a household phone connector.

In data communication and telecommunication applications, small connectors, e.g., LC, are increasingly replacing traditional connectors, e.g., SC. The main advantage of small connectors over larger sized connectors is the ability to provide a higher number of fibers per unit of rack space. Since the LC connector is roughly half the size as the SC connector, the placement of almost twice the number of connectors is possible within the same amount of space by using the LC connector instead of the SC connector.

However, there are disadvantages associated with using smaller connectors. As more connectors are placed within the same amount of space, accessing the connectors which is often performed by hand may present a challenge. Adult fingers typically have a diameter of 16 mm to 20 mm. Some people may have larger or misshapen fingers. Therefore, the use of small connectors, such as the LC having a 1.25 mm diameter ferrule, may be especially problematic for technicians having larger or less dexterous hands. Commonly, LC connectors are held together in a duplex configuration with a plastic clip. While holding smaller sized connectors in a duplex configuration may make it easier for a technician to access and/or remove LC connectors, it also means that two connectors are necessarily affected by any given servicing procedure.

There is a continuing need for new devices and systems to facilitate accessing communication adapters and/or cables supported by communication patching devices and systems.

BRIEF SUMMARY

According to one aspect of the disclosure, a communication system includes a housing, a tray, and a cable guide. The tray has a plurality of ports each having a front face connectable to a cable, the tray movably engaged with the housing and having a first position substantially inside the housing and a second position substantially outside the housing. The cable guide has a fixed position with respect to the housing and is for supporting at least one of the plurality of cables. In the first position, the front faces of the ports are a first distance from the cable guide and, in the second position, the front faces of the ports are a second distance from the cable guide less than the first distance. The cable guide may further include a mounting arm configured for fixing to the housing. The cable guide may have a plurality of shelves arranged in a stacked configuration, each shelf having a first end and a second free end spaced apart from the first end. The first end of a first shelf may be connected to the first end of a second shelf by a convex surface, the first and second shelves being adjacent to one another. A first fin may extend from the second free end of a first shelf toward a second shelf, the first and second shelves being adjacent to one another. A second fin may extend from the second free end of the second shelf toward the first shelf, the first and second fins defining an opening therebetween. The first fin may extend substantially orthogonally from the first shelf. The cable guide may further include a strap fastener configured to be coupled to one of the plurality of shelves, the strap fastener having a first free end and a second free end releasably attachable to the first free end. The first free end of the strap fastener may be configured to be coupled to the one shelf with a bolt or rivet extending through a first aperture in the strap and a second corresponding aperture in the one shelf. The first free end of the strap fastener may include one of hooks and loops and the second free end of the strap fastener may include the other of the hooks and loops.

A plurality of the trays may be arranged in a stacked configuration, a pair of adjacent trays of the plurality of trays being spaced apart by a first distance, and a pair of adjacent shelves being spaced apart by a second distance substantially equal to the first distance. When the system is in a state in which a first cable is connected at one end to one of the ports and supported by the cable guide at a portion of the first cable a predetermined length of the first cable from the one end, the first cable has a first slack when the tray is in the first position, a second slack when the tray is in the second position, and a third slack when the tray is in a third position intermediate the first and second positions, the third slack being greater than the first slack and the second slack. The tray may be adapted to slide a first distance in a first direction from the first position to the second position, wherein the cable guide is positioned a second distance in the first direction from the front faces of the plurality of ports when the tray is in the first position, the first distance being less than double the second distance. The tray may be a head of a cassette and the housing may be a housing of the cassette, the tray including at least two rails adapted to slide into and out of corresponding rail slots defined by the cassette housing. The system may also include a chassis adapted to retain a plurality of cassettes. The cable guide may be fixed to the chassis or to the housing of one of the plurality of cassettes.

According to another aspect of the disclosure, a communication system includes a housing, a tray, and a cable guide. The tray has a plurality of ports each having a front face connectable to a cable, the tray movably engaged with the housing and having a first position substantially inside the housing and a second position substantially outside the housing. The cable guide has a fixed position with respect to the housing and is for supporting at least one of the plurality of cables, the cable guide having a fixed position with respect to the housing. When the system is in a state in which a first cable is connected at one end to one of the ports and supported by the cable guide at a portion of the first cable a predetermined length of the first cable from the one end, the first cable has a first slack when the tray is in the first position, a second slack when the tray is in the second position, and a third slack when the tray is in a third position intermediate the first and second positions, the third slack being greater than the first slack and the second slack. The cable guide may include a mounting arm configured for fixing to the housing. The cable guide may include a shelving unit adapted to removably couple to the mounting arm.

According to still another embodiment of the disclosure, a communication system includes an outer housing having first and second side walls, and an inner housing at least partially positioned within the outer housing, the inner housing having first and second side walls and configured to receive a plurality of patch panel devices therein in a stacked arrangement. A hanger plate assembly including a first hanger plate is hingedly coupled to the first side wall of the inner housing and a plurality of hangers is connected to the first hanger plate in a stacked arrangement, each hanger adapted to support a cable thereon. The hanger plate assembly has a stored condition in which the hanger plate assembly is fully positioned within the outer housing, and a pulled out condition in which the hanger plate assembly is at least partially positioned outside the outer housing. The inner housing may include a plurality of slots, each slot configured to receive one of the patch panel devices therein, the hanger plate assembly including a number of hangers equal to or greater than a number of patch panel devices received in the plurality of slots. The first hanger plate may be a rigid substantially rectangular plate. Each hanger may include a flat portion with a cable guide surface extending away from the flat portion, the cable guide surface having a curvature defining a minimum bending radius. A cylindrical member may be coupled to the plurality of hangers, a portion of the cylindrical member defining the cable guide surface of each hanger. Each pair of adjacent hangers of the plurality of hangers may include a first retaining member extending from the flat portion of a first of the pair of hangers toward the flat portion of a second of the pair of hangers, and a second retaining member may extend from the flat portion of the second of the pair of hangers toward the flat portion of the first of the pair of hangers. The first and second retaining members may each be substantially cylindrical. A free end of the first retaining member may be spaced apart from the flat portion of the second of the pair of hangers, and a free end of the second retaining member is spaced apart from the flat portion of the first of the pair of hangers.

A distance between the first side wall of the inner housing and the first side wall of the outer housing may be greater than a width of the first hanger plate. The hanger plate assembly may include a plurality of additional hanger plates hingedly coupled to one another, one of the additional hanger plates being hingedly coupled to the first hanger plate. Each of the additional hanger plates may have a width, a sum of the width of each of the additional hanger plates and the first hanger plate being greater than the distance between the first side wall of the inner housing and the first side wall of the outer housing. In a stored condition, the first hanger plate and the additional hanger plates may all positioned within the outer housing. One of the additional hanger plates may be positioned at a terminal end of the hanger plate assembly and may include an end portion defining a "U"-shaped channel, the end portion extending substantially entirely along a height of the one additional hanger plate. The first hanger plate and the plurality of additional hanger plates may all have substantially equal heights. At least one of the additional hanger plates may include a cable retaining member forming at least one "U"-shaped channel extending along a width of the one additional hanger plate. The at least one "U"-shaped channel of the cable retaining member may be at least partially defined by an "L"-shaped extension. The communication system may also include a second hanger plate assembly including a first hanger plate hingedly coupled to the second side wall of the inner housing and a plurality of hangers connected to the second hanger plate in a stacked arrangement.

According to still a further aspect of the disclosure; a hanger plate assembly includes a first hanger plate and a plurality of hangers connected to the first hanger plate in a stacked arrangement. The first hanger plate is configured to be hingedly coupled to a first side wall of an inner housing of a communication system adapted to receive a plurality of patch panel devices therein in a stacked arrangement. The plurality of hangers is adapted to support a cable thereon. The hanger plate assembly is configured to have a stored condition in which the hanger plate assembly is fully positioned within an outer housing of the communication system, and a pulled out condition in which the hanger plate assembly is configured to be at least partially positioned outside the outer housing. The first hanger plate may have a rigid substantially rectangular plate. Each hanger may include a flat portion with a cable guide surface extending away from the flat portion, the cable guide surface having a curvature defining a minimum bending radius.

BRIEF DESCRIPTION OF THE DRAWINGS

By way of description only, embodiments of the present disclosure will be described herein with reference to the accompanying drawings, in which.

DETAILED DESCRIPTION

Figures 1A, 1B:
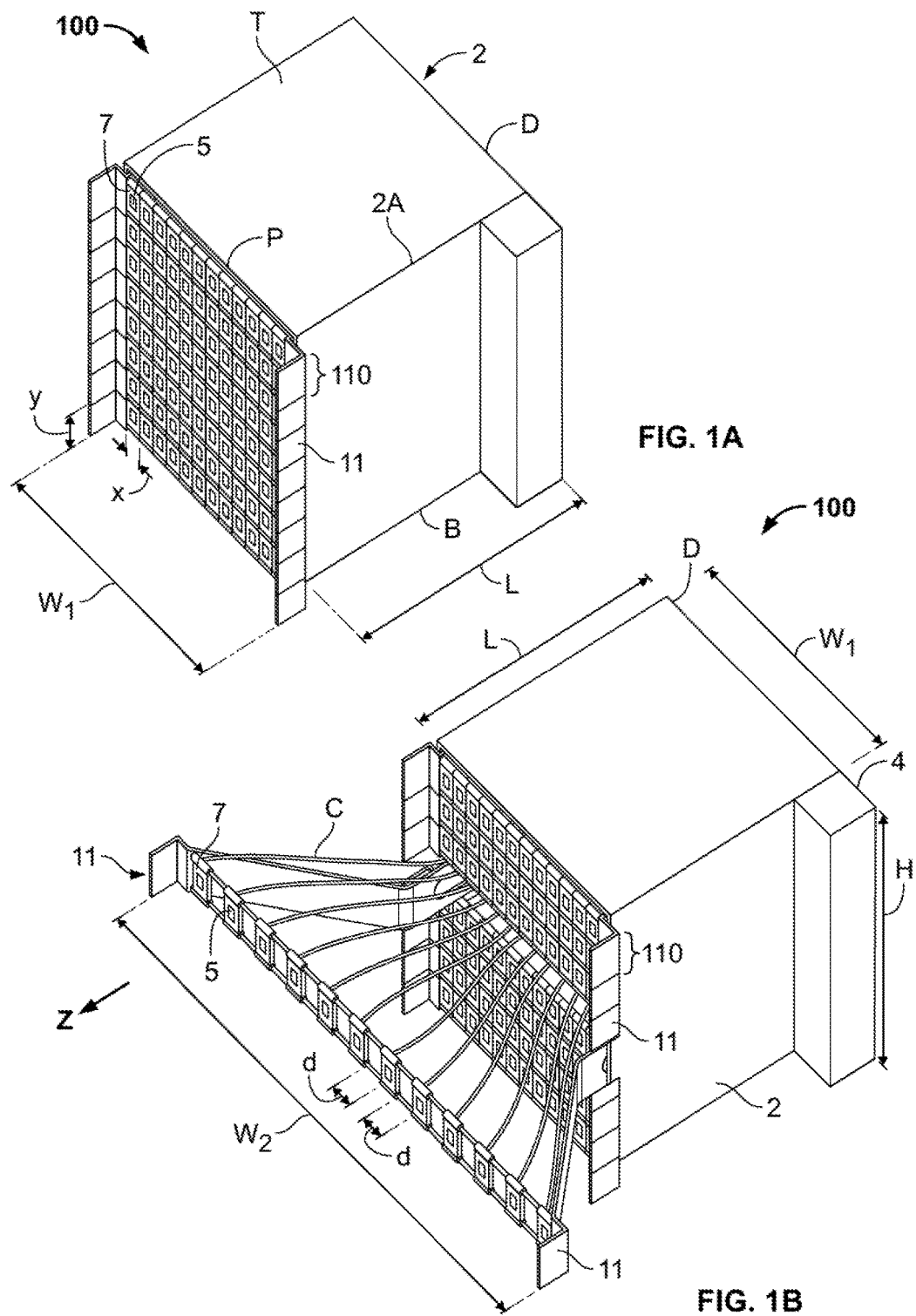
FIG. 1A is a front perspective view of a communication patching system including multiple patch panel devices shown in a first state.
FIG. 1B is the communication patching system of FIG. 1A shown in a second state.

Particular embodiments of the present disclosure are described with reference to the accompanying drawings. In the figures and in the description that follow, in which like reference numerals identify similar or identical elements, the term "proximal" refers to the end of the device that is closest to the operator or user during use, while the term "distal" refers to the end of the device that is farther from the operator or user during use.

Figure 1C:
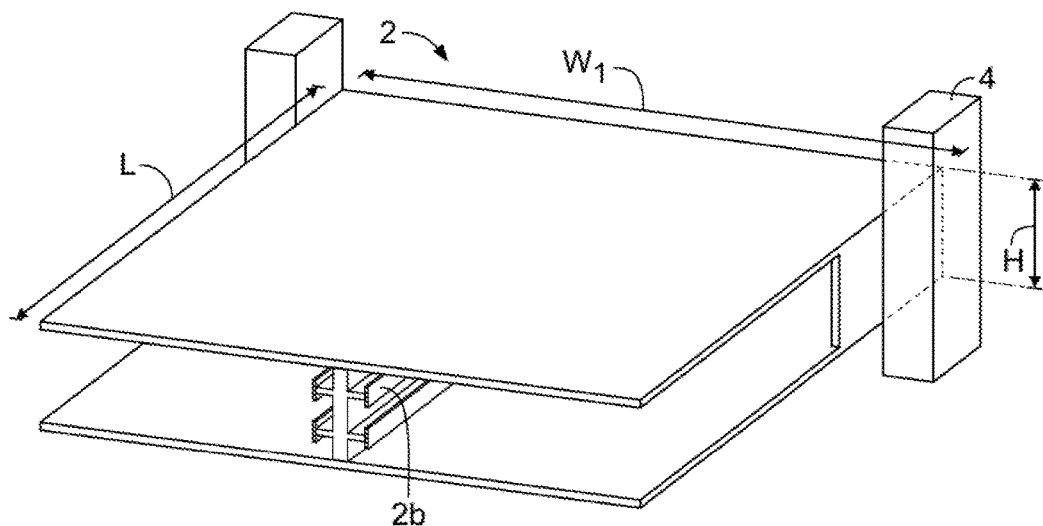
FIG. 1C is a front perspective view of a housing and cable trough, without a patch panel device placed therein.

Now referring to FIGS. 1A-C, a communication patching system 100 may include a housing 2, e.g., a rack or a cabinet. The housing 2 may define a length L, a height H, and a width $W_1$. The housing 2 may support one or more patch panel devices 110, with each device 110 held in vertical alignment with a guide rail 2b (FIG. 1C), a plurality of which may also be disposed in vertical alignment along at least one side of the housing 2. A cable trough 4 may be positioned adjacent to the housing 2, for example at a proximal corner, a distal corner, or intermediate the proximal and distal corners. The cable trough 4, which may be attached to the frame of the system 100 (which may include, e.g., poles, walls, and other supports), may be configured to receive therein a plurality of cables C extending vertically therethrough. The cable trough 4 may take any suitable form to house and guide cables including, for example, a plurality of guide rings, a groove or other hollow passageway.

Each patch panel device 110 may include a plurality of adapters or ports 7, each port 7 having a receptacle 5 for securing a cable C (FIG. 1B) therein. The receptacle 5 of the port 7 may be operatively coupled to one or more cables C, e.g., the receptacle 5 may be in a simplex or in a duplex configuration. The port 7 may include a mounting portion 51 that frames the port 7 and facilitates securing of the port 7, or the receptacle 5, to connection means, e.g., rails 41, 43 (FIG. 2C). In some embodiments, the mounting portion 51 of the port 7 may be integrally formed with the port 7 or may be a separate component coupled to the receptacle 5, and in some embodiments the mounting portion 51 may form a part of a connection means to which the receptacle 5 is connected, as described below.

The patch panel device 110 may include a tab 11 on either end of the patch panel device 110 to facilitate a user grasping or handling of the patch panel device 110. The density of the number of ports 7 supported by the housing 2 may be a function of the dimensions of the housing 2. As shown in FIG. 1A, the ports 7, each of which has a width x and a height y, may be arranged in rows and columns in which the number of rows of ports 7 is directly correlated to the height H and the number of columns of ports 7 is directly correlated to the width $W_1$.

The communication patching system 100 may be transitionable between a first state (FIG. 1A) and a second state (FIG. 1B). In the first state, the one or more patch panel devices 110 may be positioned at a first location with respect to the proximal end or face P of the housing 2. As shown in FIG. 1A, the patch panel devices 110 may be substantially flush with respect to the face P of the housing 2. In the second state, one or more of the patch panel devices 110 may be disposed proximally in the direction of arrow Z away from the proximal end or face P of the housing 2. As the patch panel device 110 is moved proximally, the ports 7 may be transitioned to be spaced apart from one another by a gap or spacing distance d (FIG. 1B).

Figure 2A:
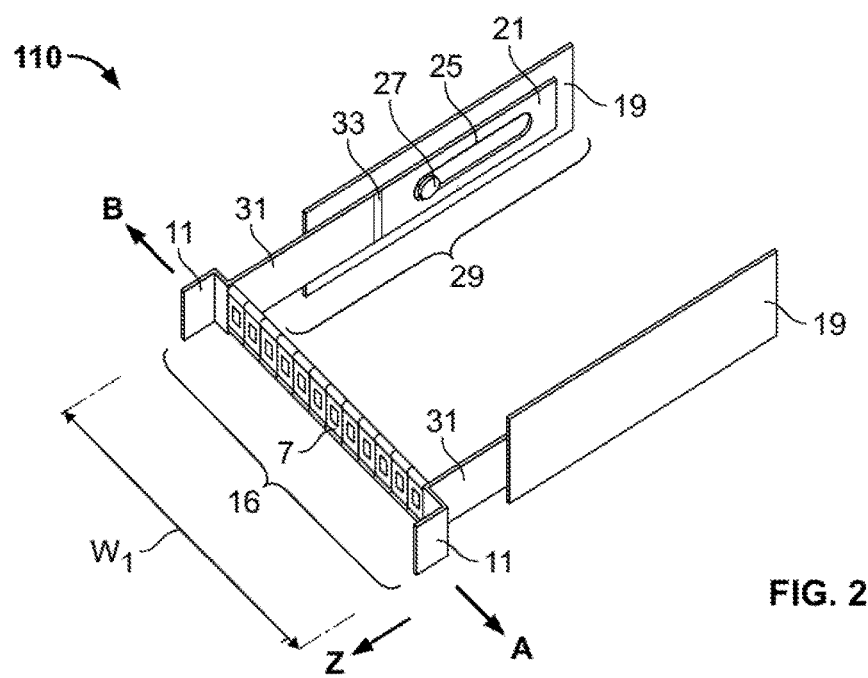
FIG. 2A is one of the patch panel devices of FIG. 1A shown in a first state.
Figure 2B:
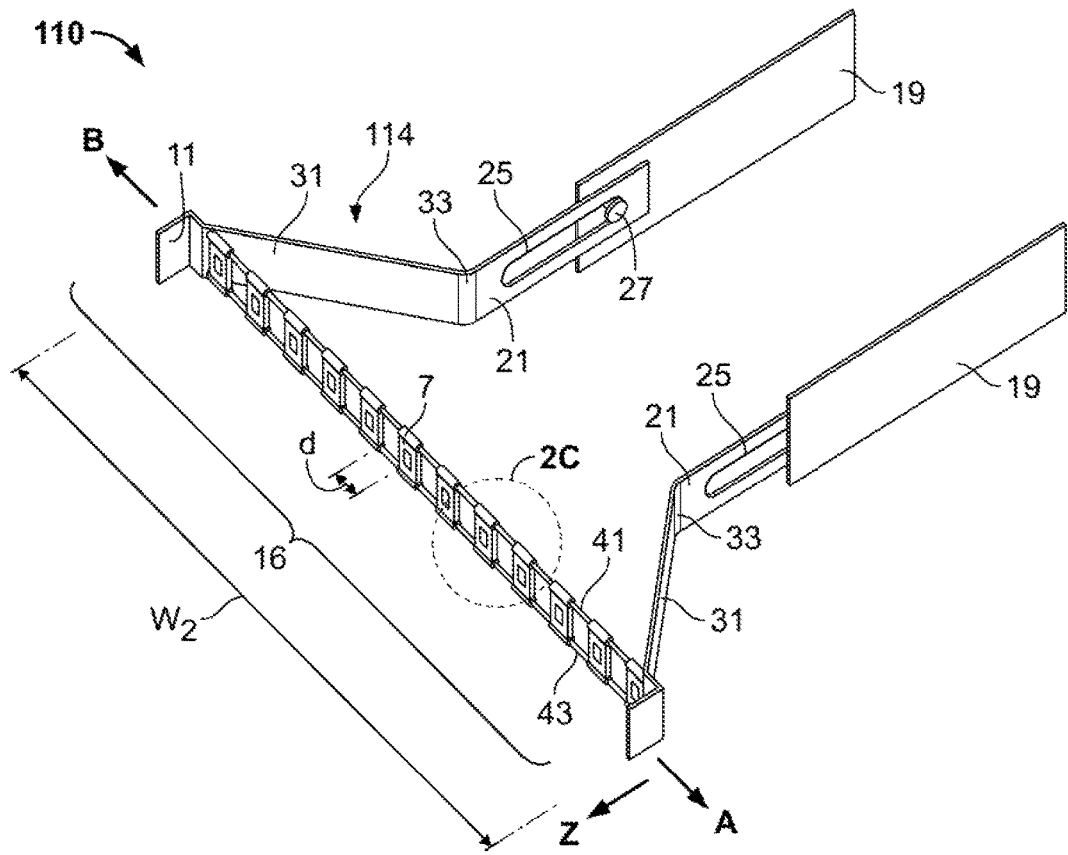
FIG. 2B is the patch panel device of FIG. 2A shown in a second state.
Figure 2C:
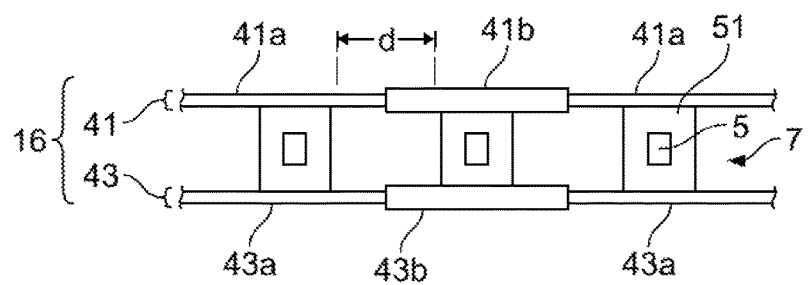
FIG. 2C is an enlarged view of the indicated area of FIG. 2B.

The patch panel device 110 may be transitionable between first and second states, as shown best in FIGS. 2A and 2B respectively. The patch panel device 110 may include bars 19, which facilitate mounting of the patch panel device within the housing 2 by securing one of the bars 19 on each of opposite sides 2a of the housing 2. A hinged arm member 114, which includes a first arm section 21 and a second arm section 31, may be slidably connected to the bar 19. The first arm section 21 may include a slot 25 which is configured and adapted to receive a pin 27 therethrough. The pin 27 may secure the first arm section 21 to the bar 19 while permitting the first arm section 21 to slide relative to the bar 19 along the length of slot 25. The first arm section 21 and the second arm section 31 of the hinged arm 114 may be pivotably connected to one another by a hinge 33, thereby facilitating the rotation of the second arm section 31 relative to the first arm section 21.

The ports 7 may be operably coupled to a connection means 16. As the connection means 16 transitions from a first length equal to width $W_1$ (FIG. 2A) to a second, expanded width $W_2$ (FIG. 2B), the ports 7 may move, or be moveable, to be positioned in a spaced apart relation. In an embodiment, the ports 7 are spaced apart. The ports 7 may be equidistantly spaced apart by equal gaps or spacing distances d. However, the spacing distances d between adjacent ports 7 may differ, i.e., be non-uniform, in the second state. In addition, individual ports 7 may be slid or moved along the length of the connection means 16, thereby facilitating adjustment of the gap or spacing distances d between adjacent ports 7 as desired by a user.

It is contemplated that the hinged arm member 114 may include a lip (not shown) that interacts with a groove (not shown) defined within the bar 19 along a portion or substantially the entire length of the bar 19 to provide added stability and controlled movement of the hinged arm member 114 relative to the bar 19.

As shown best in FIG. 2C, the connection means 16 may include one or more telescopic rails 41, 43 that are slidable to adjust the overall length of the connection means 16. Although shown in FIG. 2C as having two parallel rails 41, 43, a single rail may be used. It should be noted that the greater the overall length of the connection means 16, the greater the gap or spacing distance d achievable between adjacent ports 7. Each of the parallel rails 41, 43 may include alternating sections 41a, 41b and 43a, 43b respectively. Sections 41a, 43a may be configured and adapted to slide within sections 41b, 43b respectively, where the ports 7 may be coupled to the sections 41b, 43b, to effect lengthening or shortening of the connections means 16. A resilient or biasing member (not shown) may be placed within a hollowed out center of each of the rails 41, 43 to bias the connection means 16 to one of the first or second dimensions $W_1$, $W_2$, respectively.

The sections 41b, 43b may define an open circumference such that the ports 7 will not obstruct movement of the alternating sections 41a, 41b and 43a, 43b relative to one another such that the ports 7 may be moved in closer proximity to one another. In addition, the lengths of the alternating sections 41a, 41b and 43a, 43b may be selected to facilitate placement of the ports 7 in close proximity to one another, such that adjacent ports contact each other. Each port 7 may be secured to the rails 41, 43 in a variety of ways or may be integrally formed with the rails 41, 43. It is contemplated that in other embodiments, the rails 41, 43 may be substituted with different connection means. In an embodiment, the rails 41, 43 may be substituted with elastic bands. A variety of other configurations may be used to effect lateral, angular, or other spacing between ports in a patch panel device to increase access to the ports, such as those described in greater detail in U.S. Patent Publication Nos. 2014/0355217, 2014/0357118, and 2014/0354131, the disclosures of which are hereby incorporated by reference herein.

For example, another embodiment of a patch panel device is described with reference to FIGS. 3A-3D. A patch panel device 210 may include a plurality of attachment members 232 that are positioned adjacent to one another. Each attachment member 232 may include a movable member 246, which is rotatable or pivotable relative to a movable member of another attachment member 232. The movable members 246 of adjacent members 232 may be operatively coupled to one another to permit rotation of one of the movable members 246 relative to the other movable member. In an embodiment, the movable members 246 may be coupled to one another in a snap-fit connection that permits radial movement of the movable members 246 relative to one another. At least two securement members 244 may be secured to opposing ends of the plurality of attachment members 232 and secure the attachment members 232 to a tray 231. In another embodiment, a securement member 244 may be positioned between each of the movable members 246. Each of the movable members 246 may be operatively coupled to one or more cables C1, which are shown only in part. The movable member 246 may include a cable adapter or connector 249, which may include a front surface 249a that may be operatively coupled to one cable C1 and a back surface 249b that may be operatively coupled to another cable C1. The movable member 246 may include a receptacle 247 in which the connector 249 may be releasably secured such that the connector 249 may be separated from the attachment member 232.

The movable members 246 may be positioned spaced a distance from an edge 231a of the tray 231 to permit the movable members 246 to rotate relative to the tray 231. In one embodiment, the tray 231 may include a cut-out (not shown) at the movable members 246 to facilitate a range of movement of the movable members 246 relative to the tray 231. The tray 231 may have an axis z extending along its length, an axis y extending along its height, and an axis x extending its width. The securement member 244 may be coaxially aligned with the axis z extending along the length of the tray 231. A plurality of securement members 244 may be positioned in a row extending along axis x along the width of the tray 231.

Figure 3A:
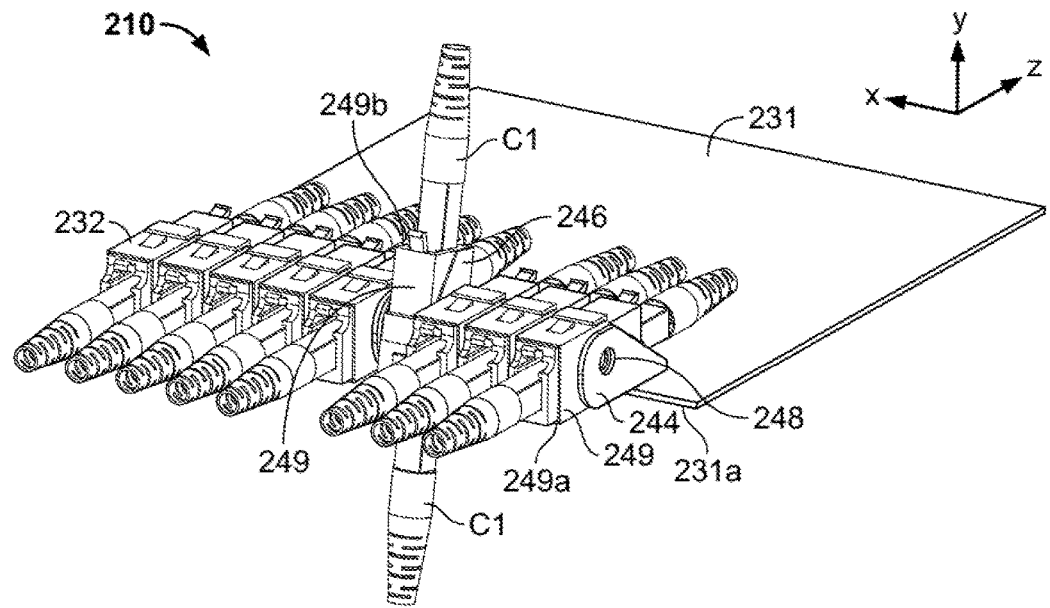
FIG. 3A is a perspective view of another embodiment of a patch panel device including a plurality of attachment members.
Figure 3B:
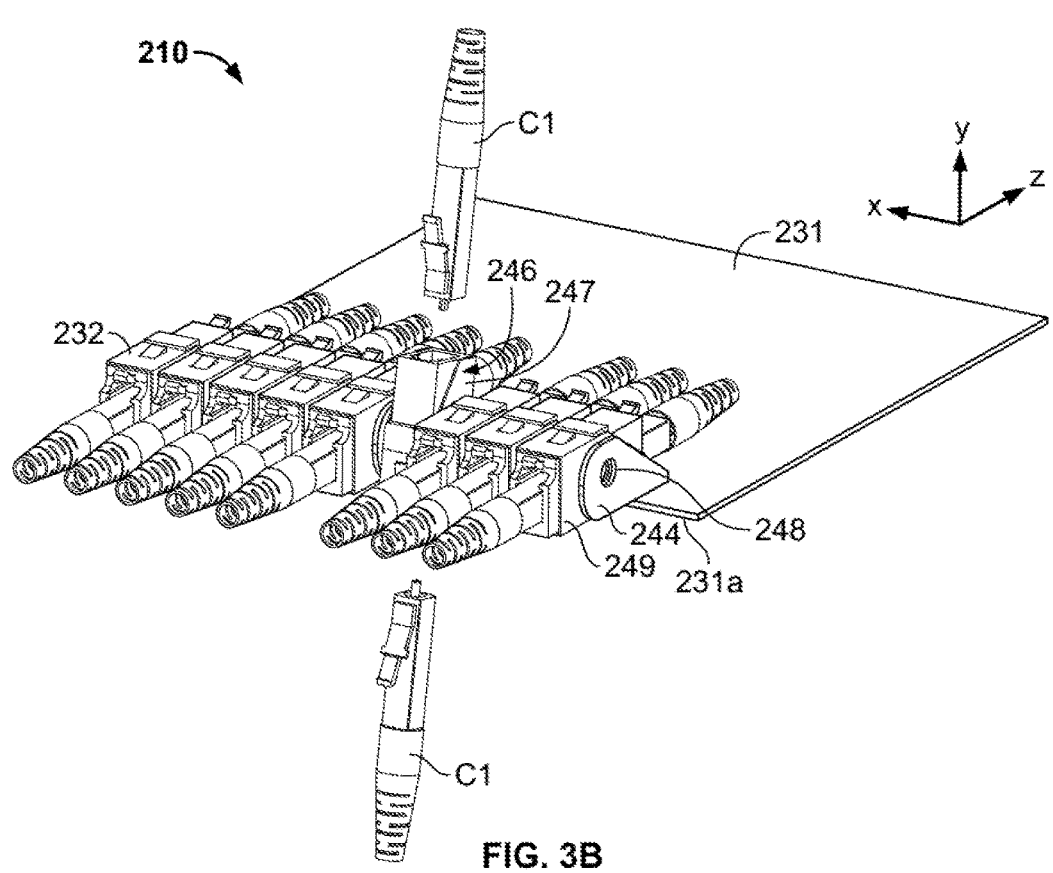
FIG. 3B is a perspective view of the patch panel device of FIG. 3A in which cables have been separated from one of the attachment members.
Figure 3C:
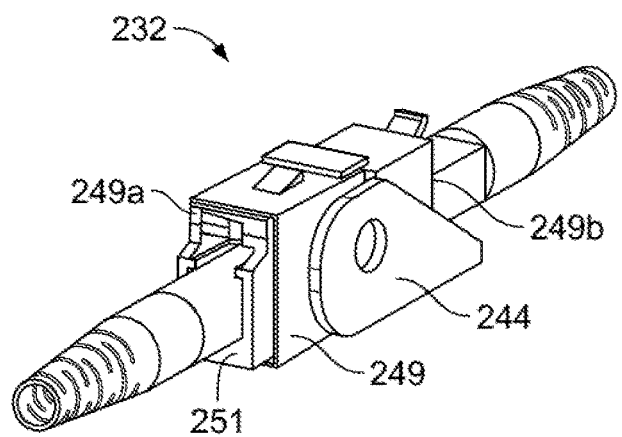
FIG. 3C is a perspective view of one of the attachment members of FIG. 3A shown in a first condition.
Figure 3D:
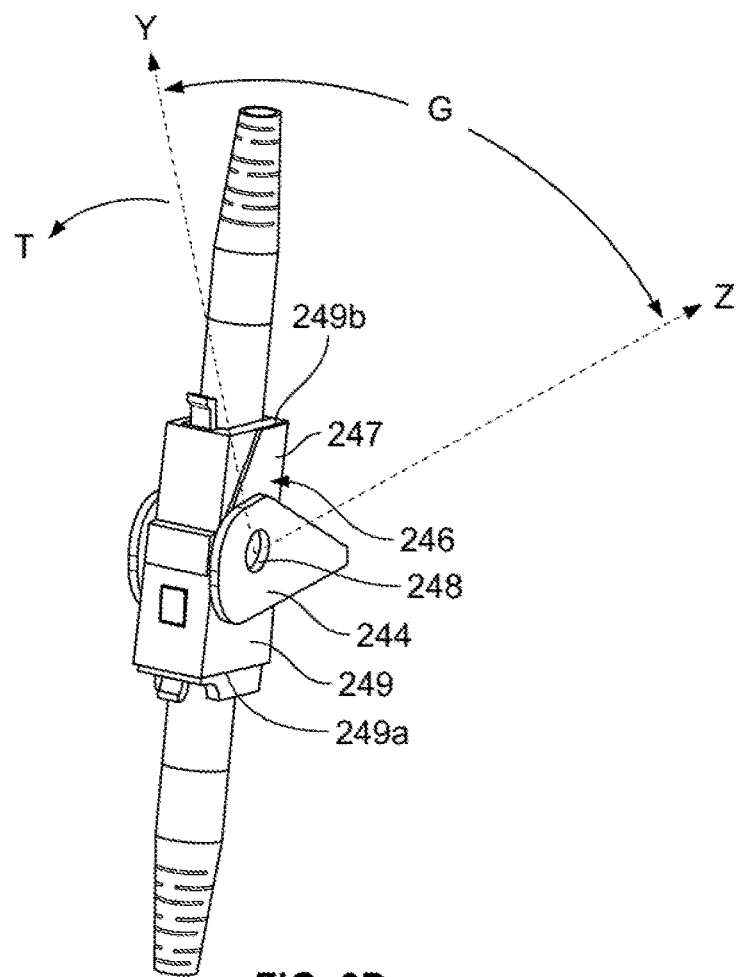
FIG. 3D is a perspective view of one of the attachment members of FIG. 3A shown in a second condition.

As shown in FIGS. 3C-3D, the securement member 244 and a movable member 246 of the attachment member 232 may be pivotably connected to one another at a pivot point 248 such that the movable member 246 may be radially moved relative to the securement member 244 to define an angle G therebetween. In particular, the movable member 246 may radially pivot between the y and z axes and the angle G may be defined therebetween. When secured to the tray 231, the movable member 246 may pivot in a counter-clockwise direction T, but may be inhibited from pivoting in the opposite, clockwise direction by the tray 231. However, as discussed above, cut-outs in the tray 231 may reduce the interaction between the tray 231 and the movable member 246 to facilitate a greater range of movement of the movable member 246 with respect to the tray 231. In an embodiment, the angle G may be adjusted within a range between about 0 and about 135 degrees. In another embodiment, the angle G may be adjusted within a range between about 0 and about 90 degrees. For example, in one embodiment, the movable members 246 may be movable relative to one another to transition the patch panel device 210 between a first condition in which front surfaces 251 of the movable members 246 are substantially coplanar, and adjacent ones of the members 246 are spaced apart a first distance or contact each other, and a second condition in which the front surfaces 251 of respective adjacent members 246 are in different planes in accordance with the angle G that one of the adjacent members 246 is pivoted or rotated relative to the other adjacent members 246, where the other member 246 may or may not be at the same position as in the first condition.

A plurality of patch panel devices 210 may also be supported within housing 2 (see FIGS. 1A-C), and may be translatable into or out from the housing 2 in a direction along axis z. Once spaced apart from the housing 2, the movable member 246 may be pivoted with respect to the securement member 244, thereby spacing the surfaces 249a, 249b of the connector 249 from any adjacent connector 249 such that the cables C1 may be more accessible and readily grasped by a user to detach the cable C1 from the cable adapter or connector 249 of the movable member 246 (as shown in FIG. 3B).

As noted above in connection with FIGS. 1A-C, a number of cables C may be coupled to ports 7 of a particular patch panel device, with the cables C extending vertically through cable trough 4. A number of systems for routing and managing cables C of patch panel systems are described below.

One embodiment of a cable management system 300 is shown in FIGS. 4A-D. Cable management system 300, as well as other embodiments of cable managements systems described herein, may be used with any suitable patch panel device, including suitable devices described herein and suitable devices described in U.S. Patent Publication Nos. 2014/0355217, 2014/0357118, and 2014/0354131, the disclosures of which are hereby incorporated by reference herein. Cable management system 300 is illustrated in FIGS. 4A-D as being used with a patch panel device 310 similar to patch panel device 210, with certain differences described in greater detail below. The cable management system 300 may include one or more cable guides 400 having a fixed position in relation to housing 2. In the embodiment shown in FIGS. 4A-D, cable management system 300 includes cable guides 400 mounted to each side of housing 2, although any configuration in which one or more cable guides 400 have a fixed position relative to housing 2 may be suitable. Cables C may be routed from ports 7, through or via cable guide 400, and to cable trough 4 (or any other suitable cable destination) so that as a tray 331 to which ports 7 are attached is pulled out of housing 2, a suitable amount of slack is maintained in cables C at different positions of tray 331. Prior to describing the function of cable guides 400 in more detail, the structure of an exemplary cable guide 400 is described in connection with FIGS. 5A-D.

Figure 5A:
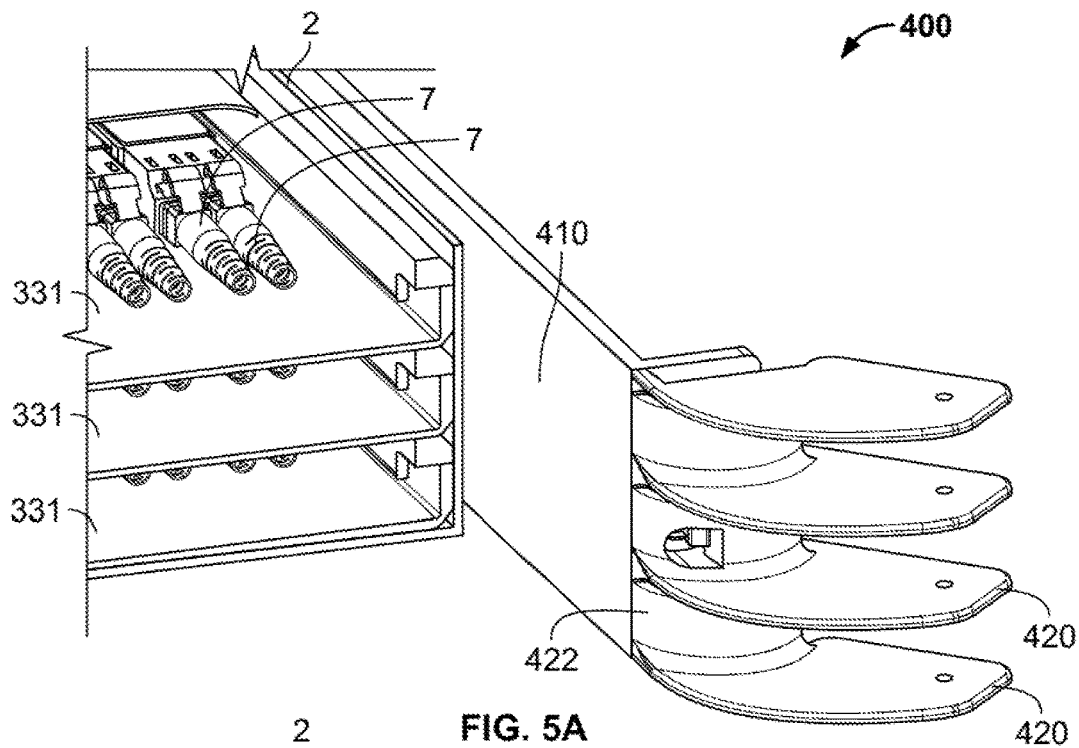
FIG. 5A is an enlarged perspective view of the cable guide of FIGS. 4A-C.

FIG. 5A shows an enlarged partial view of a lateral side of cable management system 300. In particular, three trays 331 carrying ports 7 within housing 2 are shown adjacent cable guide 400. In the illustrated embodiment, cable guide 400 includes a mounting 410 fixedly mounted to housing 2. In addition, the cable guide may include a shelving unit having a plurality of shelves 420 positioned at a front end portion of cable guide 400. Shelves 420 may include substantially flat top and bottom surfaces, although other configurations which allow cables C to rest upon the shelves 420 may be suitable. In one embodiment, cable guide 400 may include a pair of adjacent shelves 420 for each tray 331 connected to cables C, each adjacent pair of shelves 420 being spaced apart by a vertical distance substantially similar to the vertical distance between adjacent trays 331. Each adjacent pair of shelves 420 may be substantially open at a front portion and side portions, and connected, or otherwise bounded by, a rear or distal surface 422. Each distal surface 422 may be rounded, preferably with a convex curvature, so that a cable C extending along the surface 422 has a desired minimum bending radius along the surface.

Figure 5B:
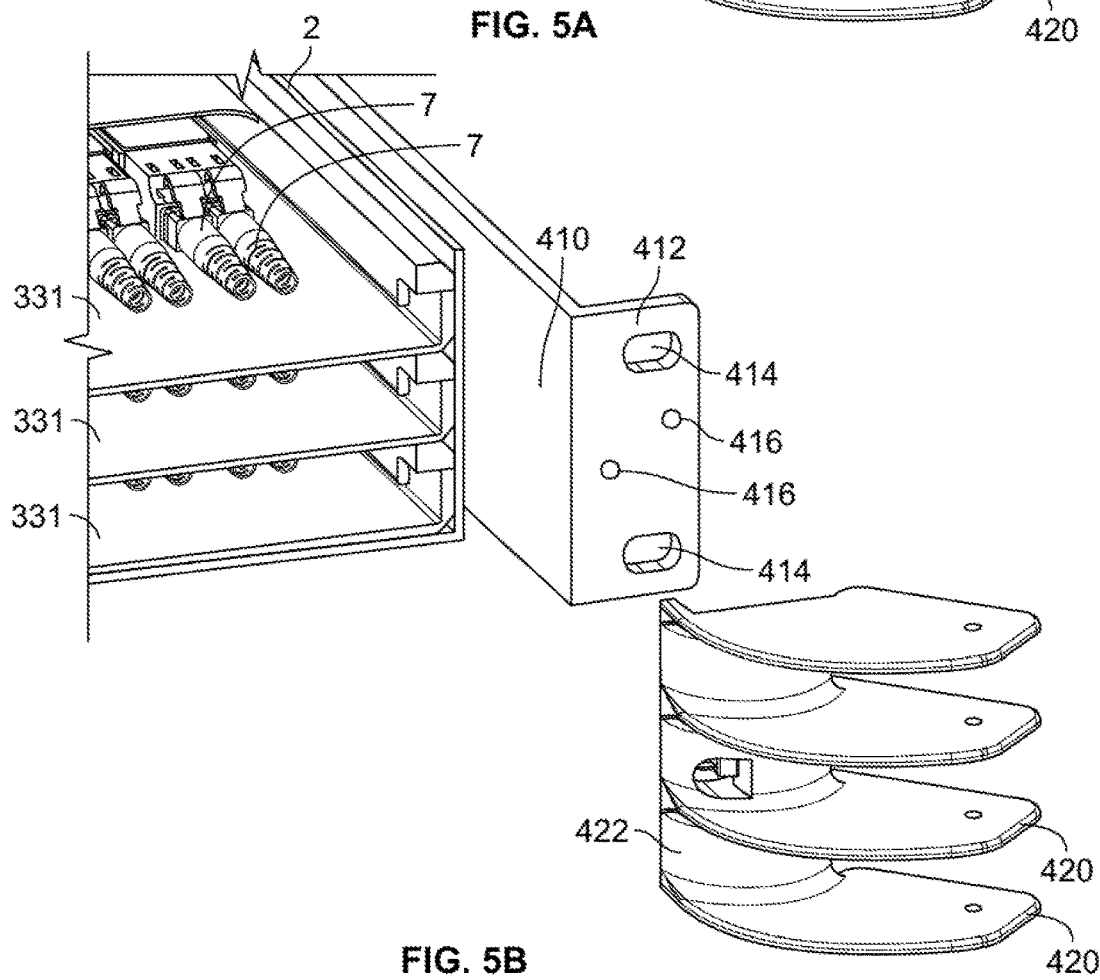
FIG. 5B is an enlarged perspective disassembled view of the cable guide of FIGS. 4A-C.
Figure 5C:
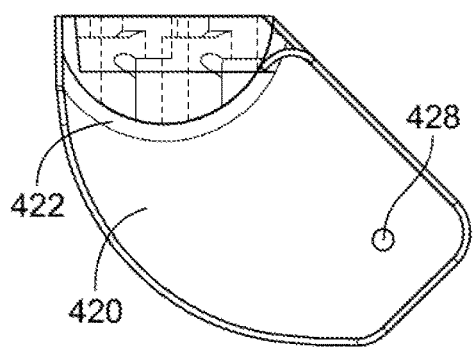
FIG. 5C is a top view of a portion of the cable guide of FIGS. 4A-C.
Figure 5D:
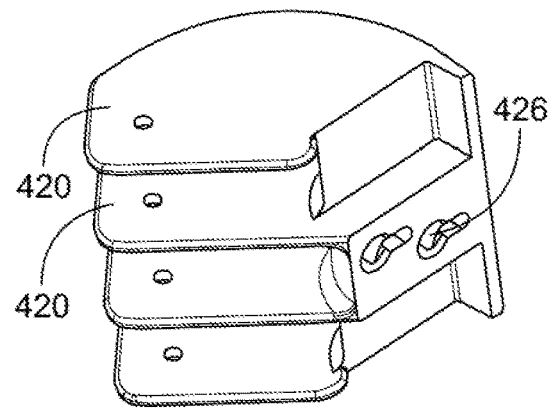
FIG. 5D is a rear perspective view of a portion of the cable guide of FIGS. 4A-C.

As shown in FIG. 5B, mounting arm 410 may include a bracket 412 with a plurality of apertures 414 for coupling to a device such as cable trough 4, or for mounting to a chassis assembly or other components that may be used in conjunction with cable management system 300. Bracket 412 may also include fasteners 416, such as bolts or pins, extending proximally from the bracket 412 to facilitate coupling the shelving unit to mounting arm 410. For example, one or more of surfaces 422 between adjacent shelves 420 may include apertures 426, best shown in FIG. 5D, shaped to mate with fasteners 416 so that the shelving unit may be quickly and securely coupled to bracket 412. One or more of the shelves 420 may include an aperture 428 (see FIG. 5C) extending therethrough for coupling accessories, such as hook and loop fasteners, to the shelf 420. Examples of these accessories are described in greater detail below in connection with FIG. 6B. It should be noted that although mounting arm 410 and shelves 420 are illustrated as separate components, the components may be provided as an integral unit. Similarly, although three pairs of adjacent shelves 420 in connection with mounting arm 410, larger or smaller mounting arms may be provided to support a greater or fewer number of pairs of shelves 420. Still further, depending on the number of trays 331 in cable management system 300, as many cable guides 400 as desired may be stacked vertically to provide suitable guidance for sets of cables C connected to each tray 331.

Figure 4A:
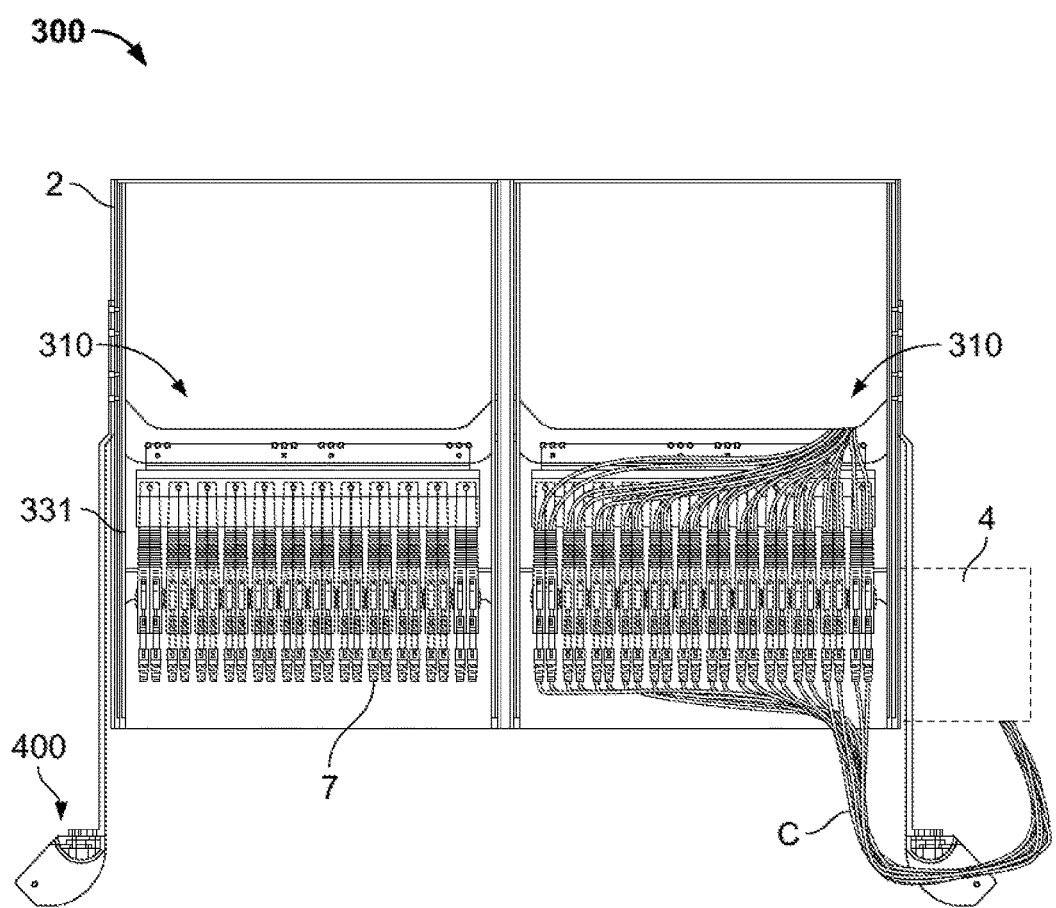
FIGS. 4A-C are top cutaway views of a cable management system having a cable guide in different states of operation.

Referring back to FIGS. 4A-D, the use of cable guide 400 in combination with cable management system 300 is described in greater detail. FIG. 4A illustrates a top cutaway view of cable management system 300, including a housing 2 having a first plurality of trays 331 stacked vertically adjacent a second plurality of trays 331 stacked vertically (only one tray 331 from each group visible in FIG. 4A). The trays 331 are shown in FIG. 4A in an installed or stored position in which the trays 331 are fully or substantially fully positioned within housing 2. The trays 331 are slidable with respect to housing 2 so that, when in a pulled out condition, as shown in the right tray 331 in FIG. 4B, the ports 7 are more easily accessible to a user. In the embodiment shown in FIGS. 4A-D, the ports 7 are pivotally connected to tray 331 at a rear portion of the port 7 so that the ports 7 may swing side-to-side with respect to one another (see FIG. 4C) to create additional space when the tray is in the pulled out position. One set of cables C is connected to front or proximal ends of ports 7 and routed through cable guide 400 into cable trough 4. Patch panel systems having pivoting ports are described in greater detail in U.S. Pat. No. 8,939,792, the disclosure of which is hereby incorporated by reference herein.

Each port 7 may include a front cable C coupled to the front end and a rear cable C coupled to the rear end. In the embodiment shown in FIGS. 4A-D, a front set of cables is coupled to the proximal end of ports 7 and passed through cable guide 400 and into cable trough 4. A rear set of cables C is coupled to the distal end of ports 7 and passed into a rear portion of housing 2. These rear cables C may be connected to electronic components in a module in the rear of housing 2, to a connector in the rear wall of housing 2 that provides a connection to other cables outside the housing, or they may be passed through an opening in the back of housing 2. In other embodiments, the rear cables C may pass through the front of housing 2, through cable guide 400 and into cable trough 4 (or other suitable destination), similar to the front cables C.

Generally, when cables are attached to ports on a sliding tray in a patch panel communication type system, cable management may become difficult. For example, for cables coupled to a front of a set of ports, as the tray is moved from the stored position to a pulled out position, slack in the front cables increases from a minimum to a maximum. When the tray is at a position in which the cables have a maximum slack, if there is too much slack, the likelihood that the cables get caught on or otherwise interfere with components of the system may be increased. Further, too much slack may make it more difficult to manipulate the cables when the tray is in the pulled out position. Too little slack may also complicate the ability to manipulate the cables, for example by limiting the ability of ports to move away from one another, and may otherwise increase the risk of detrimental stresses being placed on the cables. As is described in greater detail below, cable management system 300, in combination with cable guide 400, may provide cable management, including slack management, in a simple and effective fashion.

Figure 4B:
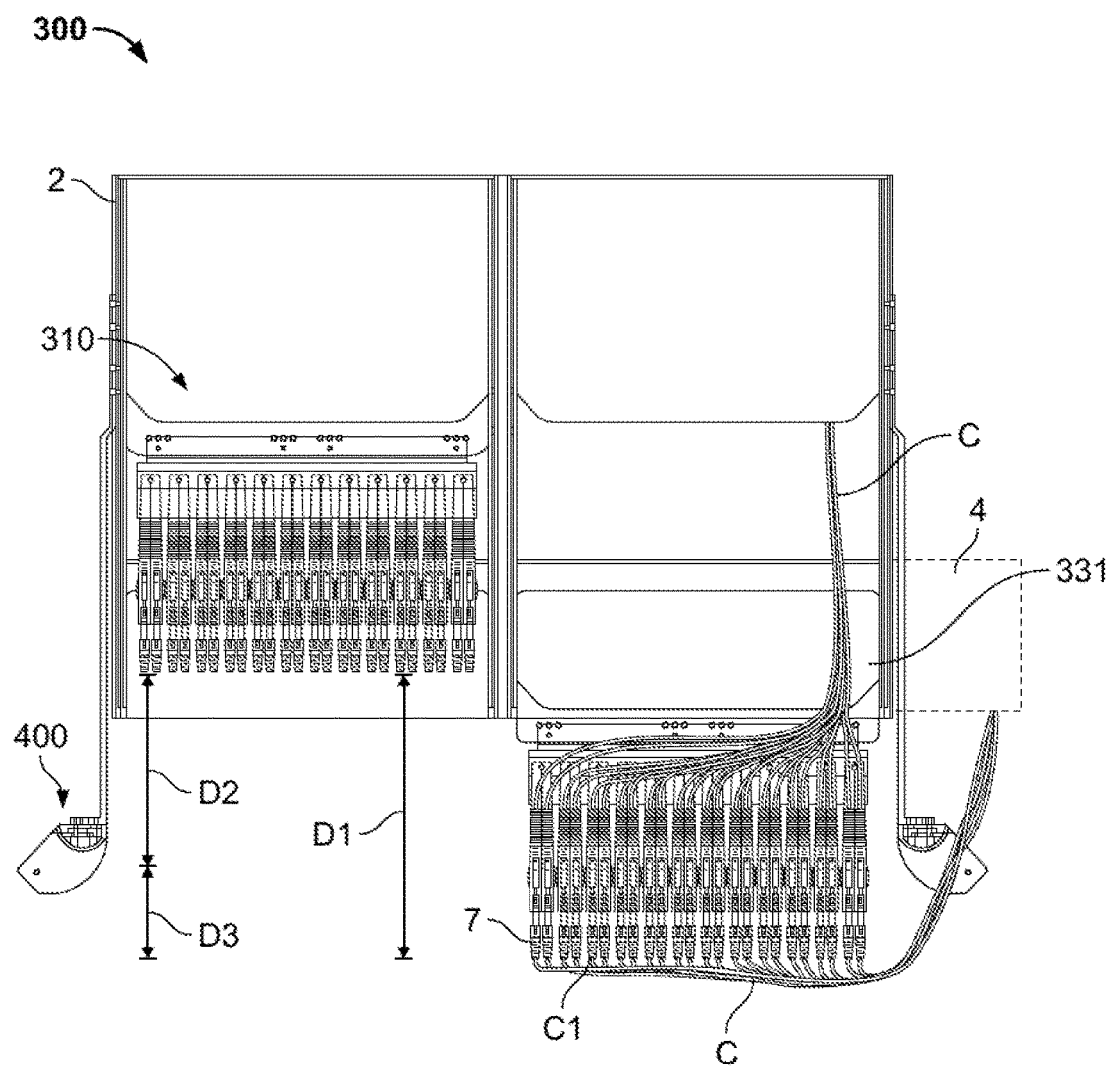
Figure 4C:
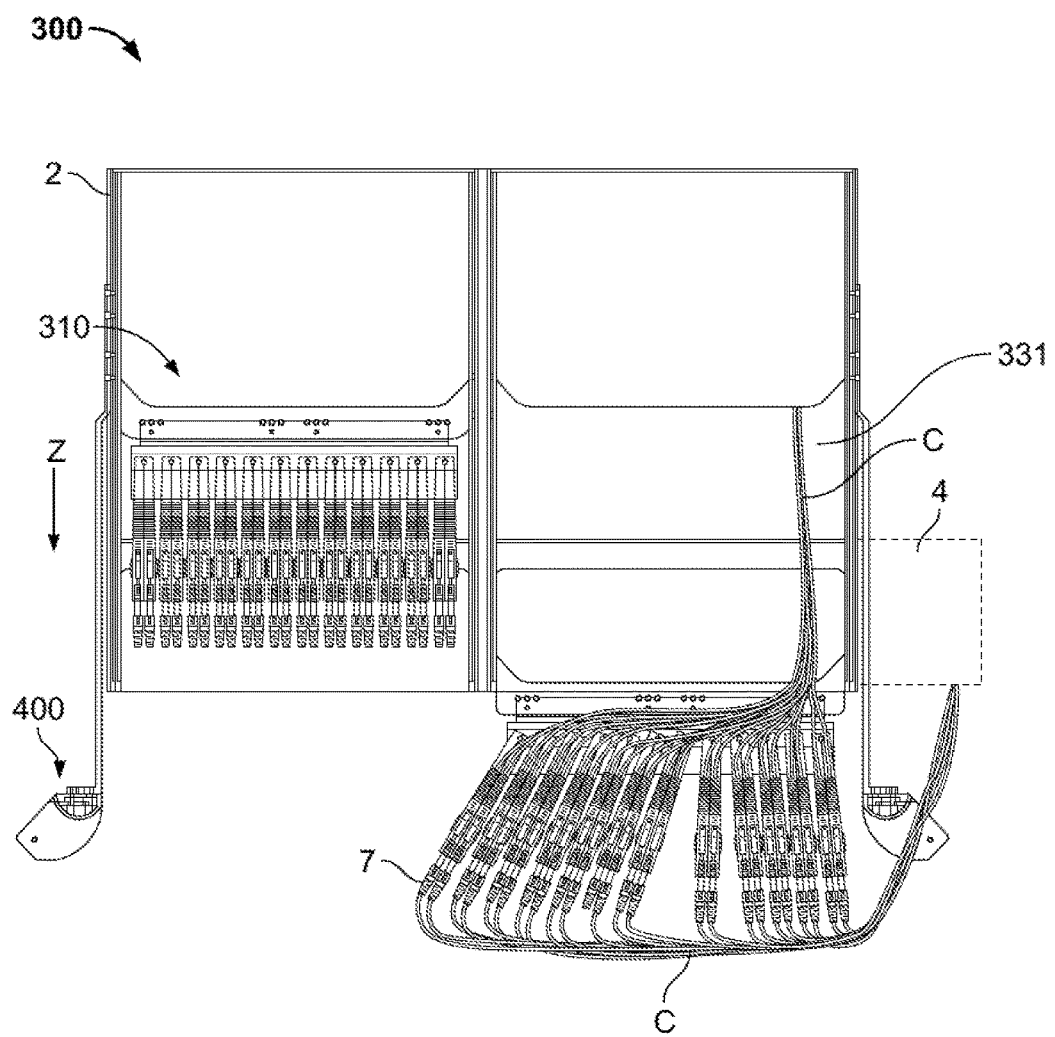
Figure 4D:
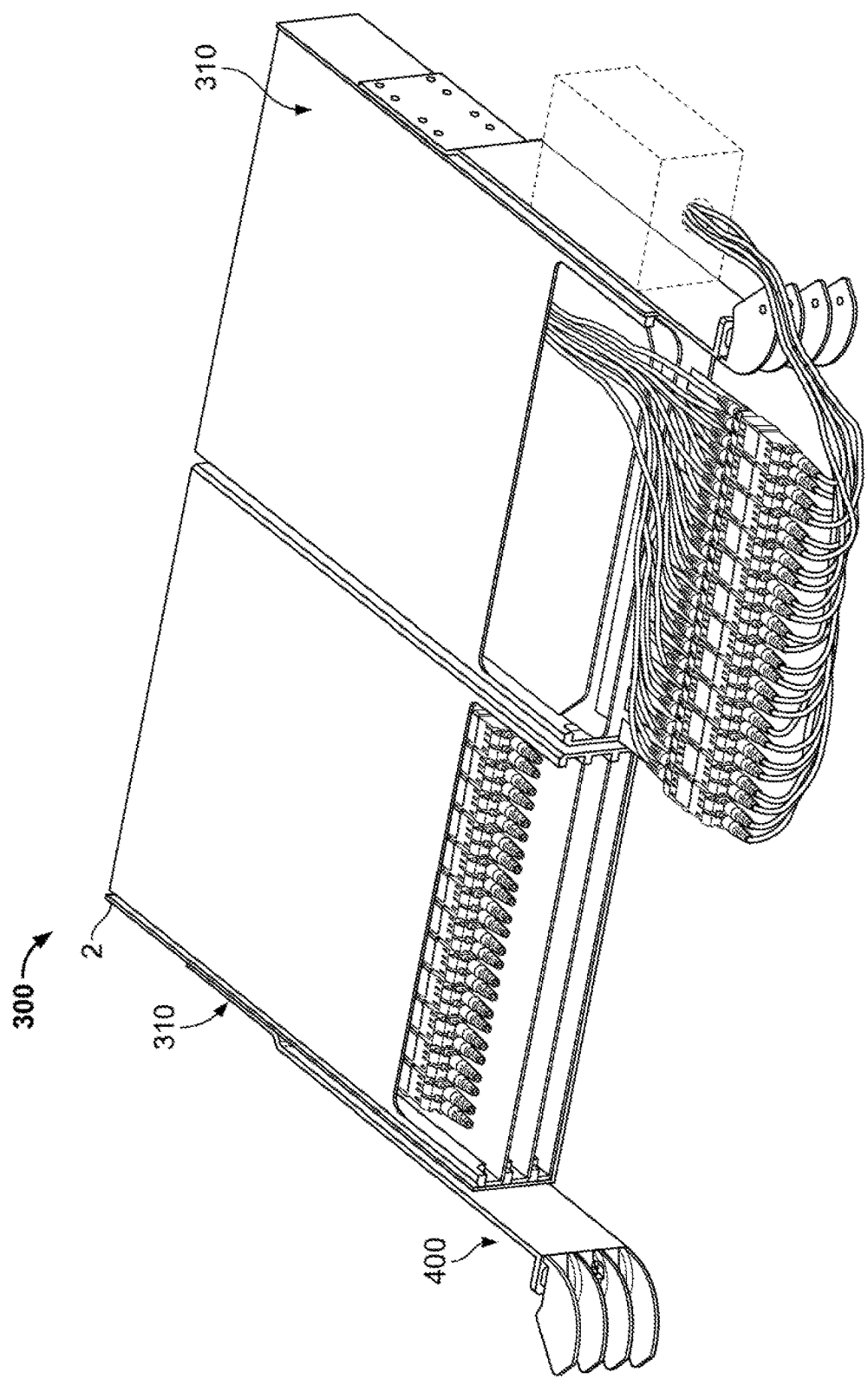
FIG. 4D is a perspective view of the cable management system of FIGS. 4A-C.

As shown in FIGS. 4B-C, ports 7 have a maximum slidable distance in the Z direction of D1, representing the distance between the stored position, represented by the left tray 331 in FIG. 4B, and the pulled out position, represented by the right tray 331 in FIG. 4B. The shelves 420 of cable guide 400 are positioned lateral to the lateral-most port 7. In addition, shelves 420 may be positioned a distance D2 in the Z direction from the proximal end of ports 7 when tray 331 is in the stored position, and a distance D3 in the Z direction from the proximal end of ports 7 when tray 331 is in the pulled out position. In the illustrated system 300, the distance D2 is greater than the distance D3, with the sum of distances D2 and D3 being equal to the distance D1. With this configuration, front cables C may be managed in the system 300 where the front cables C are connected at one end C1 to a front of the ports 7, and each of the front cables is supported by the cable guide at the shelves 420 at a portion of the front cable a predetermined length of the front cable from the one end C1. In such cable connection arrangement, the slack in front cables C increases as tray 331 is pulled out until the tray 331 travels the distance D2, where the proximal ends of ports 7 are transversely aligned with shelves 420. At this point, the slack in the cables is at a maximum, as the cables remain supported at the cable guide at the portions that are respectively predetermined lengths from the ends C1. As a user continues to pull tray 331 further proximally to the completely retracted position represented by the right tray 331 in FIG. 4B, the slack begins to decrease as the cables become tauter, the cables again remain supported at the cable guide at the portions that are respectively predetermined lengths from the ends C1. It should be understood that in other examples, the cable guide 400 may be positioned a different distance in the Z direction. For example, the shelves 420 of the cable guide 400 may be positioned proximal to the front face of ports 7 when the tray 331 is in the stored position as well as in the pulled out position.

In the configuration illustrated in FIGS. 4A-D, there is more slack in front cables C when the tray 331 is in the pulled out position than when the tray 331 is in the stored position. When tray 331 is in the stored position, front cables C are generally not manipulated since the ports 7 are within, or flush with the front of, housing 2. Because the front cables C are generally not manipulated when the tray 331 is in the stored position, the front cables C can be relatively taut to help maintain the cables C in an organized fashion. On the other hand, if a user intends to manipulate front cables C, he or she may generally transition tray 331 into the pulled out position. Further, when in the pulled out position, the ports 7 are capable of moving laterally apart (or vertically apart in a system similar to the patch panel device 210 of FIG. 3A) with respect to one another to provide the user better access to the ports 7, as shown in FIG. 4C. For these reasons, it is desirable for at least some slack to remain in the front cables C when the tray 331 is in the pulled out condition. However, the slack is desirably the minimum amount to allow for the motion of ports 7 and manipulation of front cables C. Thus, it is desirable that the slack in the front cables C is not at a maximum when in the tray 331 is in the pulled out position. It is noted that in the pulled out position of the tray, when one of the ports 7 is manipulated from a normal position such as shown on the left tray of FIG. 4B, the one front cable C connected thereto may move such that the portion of the one front cable C is not positioned at, and therefore not supported by, the cable guide. However, when the port 7 is returned to a normal position, the portion of the one front cable C connected thereto may return to a state at which the portion of the one front cable C is positioned at, and supported by, the cable guide. Each of the conditions described above is met with the cable management system 300 and cable guides 400 illustrated in FIGS. 4A-C. It should further be understood that effective cable management may still be provided when the cable guide 400 is positioned differently. For example, even if the shelves 420 of cable guide 400 are positioned proximal to the front face of ports 7 in all positions of tray 331, slack management and cable organization may be provided in an effective and relatively simple fashion. With that configuration, cables C may have maximum slack when tray 331 is in the pulled out position, which maximum slack is desirably enough to manipulate cables C at ports 7, with the slack reducing as tray 331 is pushed into the stored position. The configuration described in connection with FIGS. 4A-D may also help limit or eliminate movement of the cables C within the cable trough 4, and also between cable guide 400 and the cable trough 4, during movement of the tray 331.

In order to achieve the benefits described above, it is desirable that cables C passing over a surface of a shelf 420 of cable guide 400 remain positioned on or at the shelf 420 and/or within the boundaries of adjacent shelves 420, when the position of the tray is switched among the completely retracted, pulled out and stored positions and there is no user manipulation of the ports or the front cables. One way to help achieve this result is by adding one or more features to cable guide 400 to provide vertical limits on the movement of cables C and/or constraints on the ability of the cables C to otherwise move. The features described below may also help to further limit or eliminate movement of the cables C within the cable guide 400, as well as to limit or eliminate movement of the cables C in the cable trough 4 or at positions between the cable guide 400 and the cable trough 4.

Figure 6A:
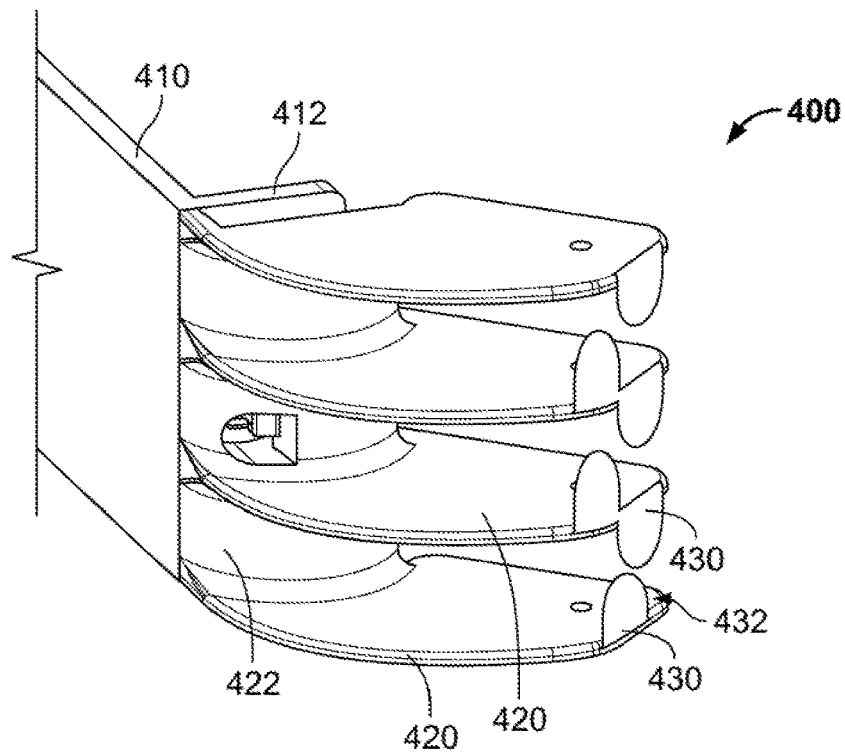
FIG. 6A is a perspective view of a portion of the cable guide of FIGS. 4A-C with cable retaining features.

One structure that may aid in maintaining the cables C within adjacent shelves are the fins 430 illustrated in FIG. 6A. In the illustrated embodiment, one or more fins 430 are positioned on a free end of each shelf 420. In particular, a first shelf 420 may include a fin 430 on a free end extending substantially perpendicular to the surface of the first shelf toward a second adjacent shelf. Similarly, the second adjacent shelf 420 may include a fin 430 on a free end extending substantially perpendicular to the surface of the second shelf toward the first shelf. In this embodiment, fins 430 are substantially rigid, although using deflectable fins may be suitable, as described in greater detail below. The fins 430 may not extend completely toward the adjacent shelf 420, and the fins that extend toward one another are offset so that an opening 432 is defined between the fins 430. With this configuration, cables C may be relatively easily inserted into, or removed through, the space between adjacent shelves 420 through the opening 432 if a user desires to install or remove a cable C from the system. However, the opening 432 is preferably small enough and oriented with respect to cables C so that, during normal operation of the cable management system 300, the cables C are unlikely to pass through opening 432 unintentionally.

Although two fins 430 are shown in each space between adjacent shelves 420, other configurations may be suitable. For example, a single fin may extend nearly all the way to the adjacent shelf 420, with a small opening or slot being defined between the end of the fin and the adjacent shelf 420. Still further, a single fin 430 could extend to touch the adjacent shelf 420 with the fin being deflectable so that a user could push a cable C toward the fin, causing the fin to deflect inward until the cable C passes into the space between adjacent shelves 420. Once the cable C is positioned between the adjacent shelves 420, the fin would return to its original position extending from a first shelf and touching the adjacent shelf, isolating the cable C between the adjacent shelves 420. The deflectable fin may have enough stiffness such that cables C would be unlikely to apply enough force to the fin during normal operation of the cable management system 300 to cause significant deflection of the fin. Still other variations may be suitable, such as two fins 430 extending toward one another from adjacent shelves 420 so that the fins touch, but the fins being deflectable so that a cable C may be pushed toward the fins causing them to deflect to allow the cable C to pass beyond the fins.

Figure 6B:
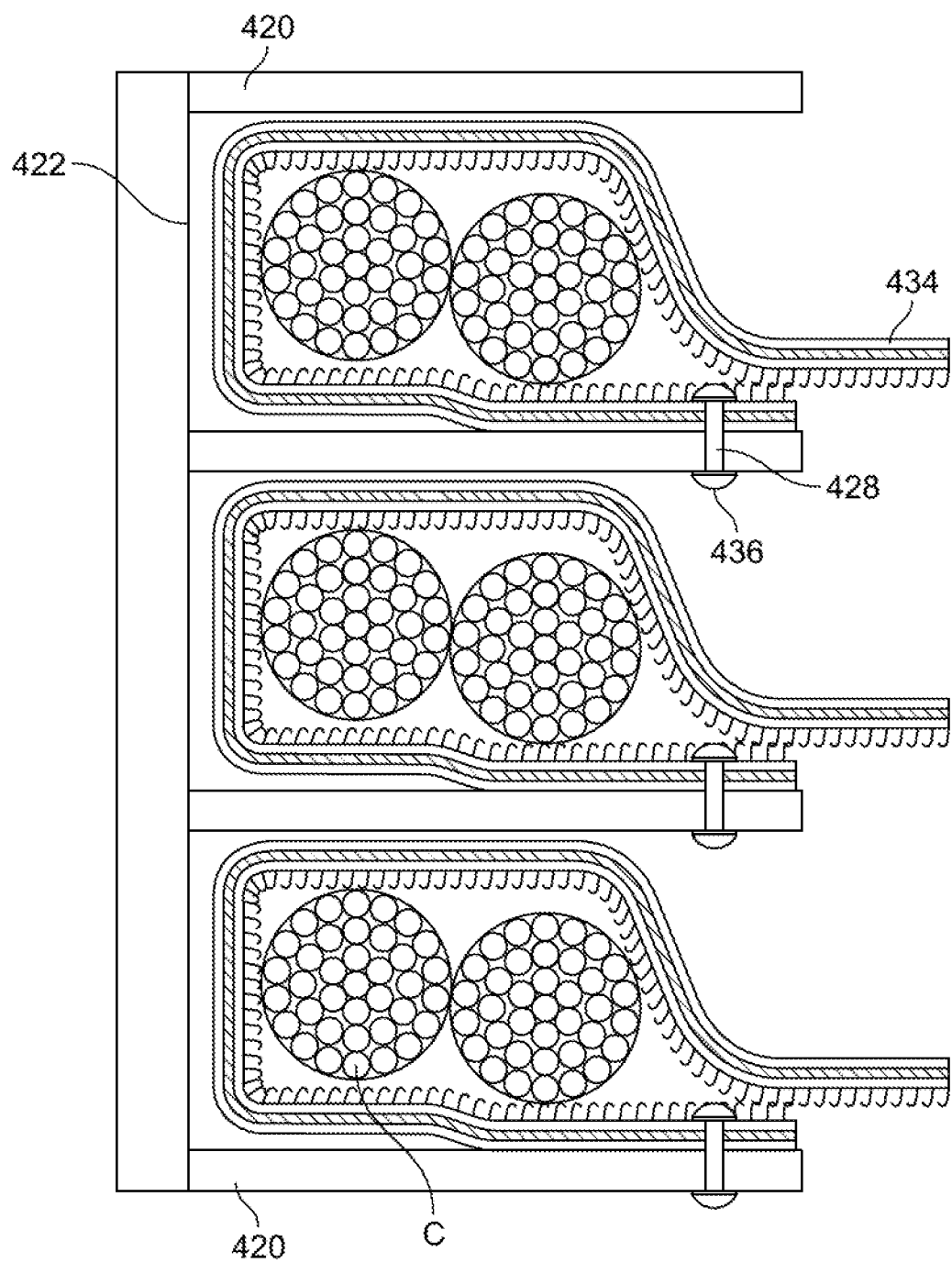
FIG. 6B is a cross-section of a portion of the cable guide of FIGS. 4A-C with alternative cable retaining features.

FIG. 6B shows a cross-section of the shelves 420 of the shelving unit of cable guide 400 with additional components to help secure cables C between adjacent shelves 420. Shelves 420 may be the same as those described above, with or without fins 430. A fastening device, such as a hook and loop strap 434, may be provided for each shelf 420 that is to support cables C. Hook and loop strap 434 may be, for example, a device provided under the trade name VELCRO, but other type of fastening straps may be suitable, for example straps having snap closures, hook closures, adhesive closures, etc. A first free end of fastener 434 may include an aperture that may align with aperture 428 in a shelf 420, with a fastener such as a rivet or bolt 436 coupling the first free end of fastener 434 to shelf 420. Cables C may be inserted between adjacent shelves 420, with free ends of fastener 434 wrapping around the cables C. With the cables C in a desired position, the second free end of fastener 434 may be coupled to the first free end, for example via a hook and loop mating system. With this configuration, rivet or bolt 436 keeps the fastener 434 in a desired position, with the fastener 434 keeping cables C secure between adjacent shelves 420. It should be noted that, in FIG. 6B, two groups of cables C are shown, each group of cables C positioned within a sleeve to help further organize the cables. Two groups of cables C may pass through a single pair of adjacent shelves when, for example, the sets of front cables C and rear cables C both are routed through the front of the housing 2.

Figure 6C:
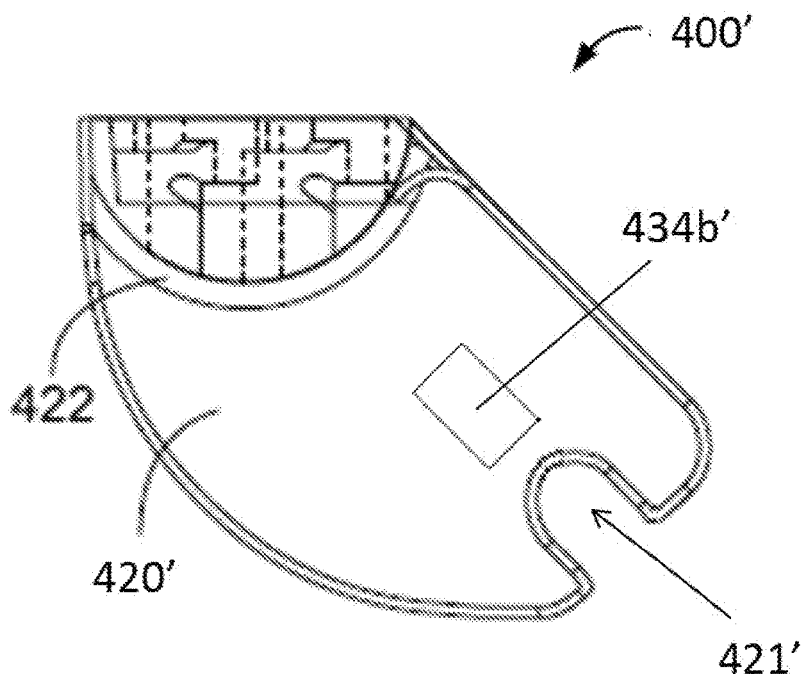
FIG. 6C-D are top and perspective views, respectively, of an alternate embodiment of the cable guide of FIGS. 5C-D.
Figure 6D:
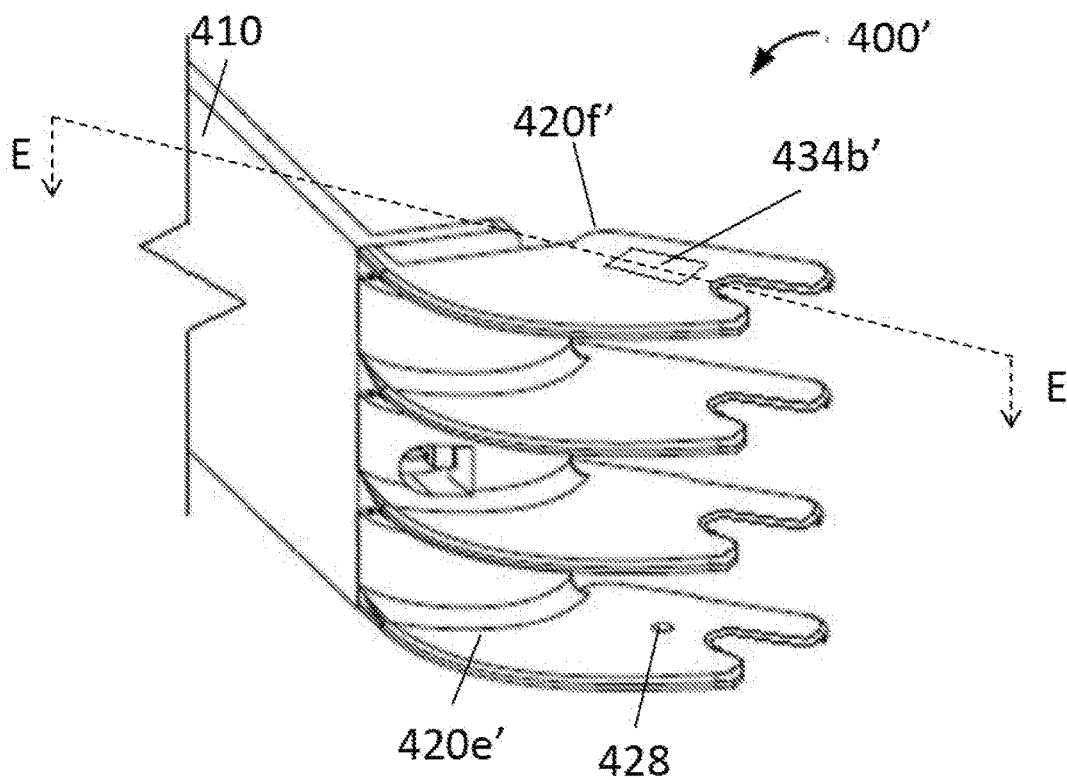

FIGS. 6C-D show views of a modified cable guide 400' that is identical to cable guide 400 with the exception of the features noted below. Cable guide 400' may include an identical mounting arm 410 for mounting to housing 2. In addition, cable guide 400' may include a shelving unit having a plurality of shelves 420' arranged in a stack configuration. Shelves 420' may include substantially flat top and bottom surfaces of a generally similar shape to shelves 420, and be connected by rounded surface 422. However, unlike shelves 420, a recess 421' may be formed in the proximal end of each shelf 420. In the illustrated embodiment, each recess 421' is generally "U"-shaped, although other shapes including rectangular may be suitable. For each unit of shelves 420', shelf 420$e'$ at one end of the stack may include an aperture 428. The aperture 428 may be configured to receive a bolt or other device to couple a first element of a fastening device to the shelf 420$e'$, and a second element of a fastening device may be coupled to the top surface of 420$f'$, which is at the other end of the stack. With this configuration, as explained in greater detail below in connection with FIG. 6E, a single fastening device may be used to secure cables C between each pair of shelves 420' in the unit, rather than having a separate fastener dedicated to each pair of adjacent shelves 420'.

Figure 6E:
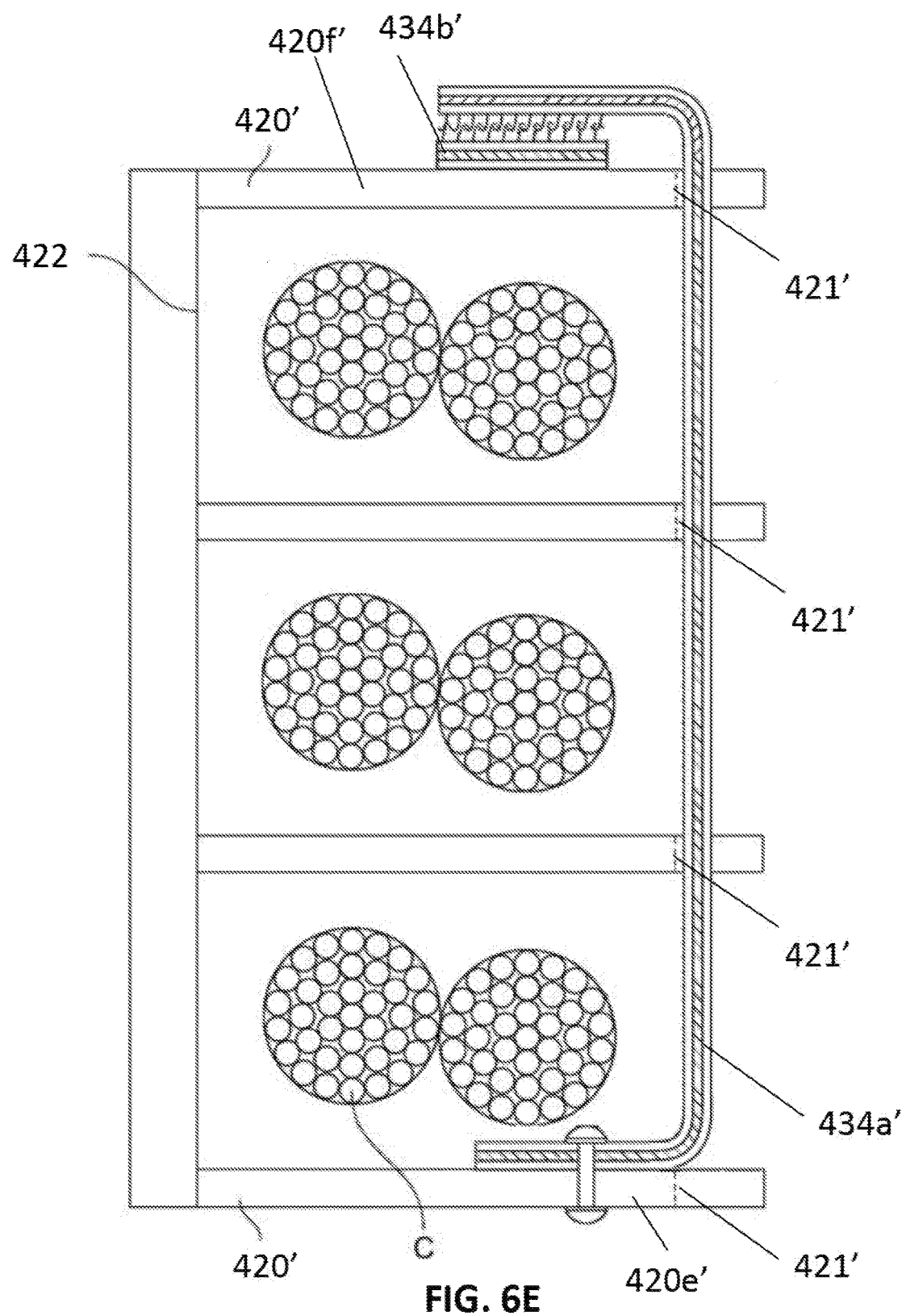
FIG. 6E is a cross-section of a portion of the cable guide of FIG. 6D at line E-E in an exemplary installed state.

FIG. 6E shows a cross-section of the unit of shelves 420'. In the illustrated embodiment, the first element of the fastening device may take the form of a first strap 434$a'$ that is bolted or otherwise fixed to a top surface of the shelf 420$f'$. An end portion of the first strap 434$a'$ may include a closure mechanism, such as hooks or loops of the type provided under the trade name VELCRO. The first strap 434$a'$ may be long enough to extend at least a length of the shelving unit from the shelf 420*e*' to the shelf 420*f*', preferably may be positioned in the space formed by the recess 421' in each shelf 420', and desirably has enough additional length so that the closure mechanism may extend at least some distance over the top surface of the shelf 420*e*'. The second element of the fastening device may take the form of a second strap 434*b*'. In the illustrated example, the second strap 434*b*' may have a relatively short length and may be fixed to the top surface of the shelf 420*e*' so that the second strap 434*b*' does not have any significant freedom of movement. The second strap 434*b*' may include a closure mechanism that corresponds to the closure mechanism at the end of the first strap 434*a*', which may be hooks (if first strap 434*a*' includes loops) or loops (if first strap 434*a*' includes hooks). It should be understood that the corresponding closure mechanisms of the first strap 434*a*' and the second strap 434*b*' may take other forms, such as snaps, hooks, adhesives, buckles, etc. With the above-described configuration, a user is able to secure all of the cables C housed within a shelving unit with a single motion. In other words, with the cables C positioned between the desired pairs of adjacent shelves 420', the user may grasp the first strap 434*a*' and couple the closure mechanism at the end of the first strap 434*a*' to the second strap, making sure to guide the intermediate portion of the first strap 434*a*' into the recess 421' of each shelf 420'. It should be noted that the number of shelves 420' within a given shelving unit may be altered as desired, with the length of the first strap 434*a*' depending mainly on the total end to end length of the shelving unit. It should further be understood that one of the end shelves in the shelving unit does not necessarily need to include a recess 421', and may rather take a shape similar to other shelves 420' in the shelving unit without such a recess. In addition to providing a simple and fast mechanism for securing cables C within the shelving unit, the configuration described in connection with FIGS. 6C-E may maximize the amount of space available for cables C between each pair of shelves 420*a*'. One additional benefit of this configuration is that, if cables C are positioned anywhere along the length of the recess 421', first strap 434*a*' may be able to make contact with those cables C to secure those cables C in place. So, even if a volume of cables C is positioned so that the cables C extend to a portion of recess 421', additional cables C may be added within the space between the two adjacent shelves 420' with the first strap 434*a*' being able to secure the cables C between the shelves 420'.

Figure 7:
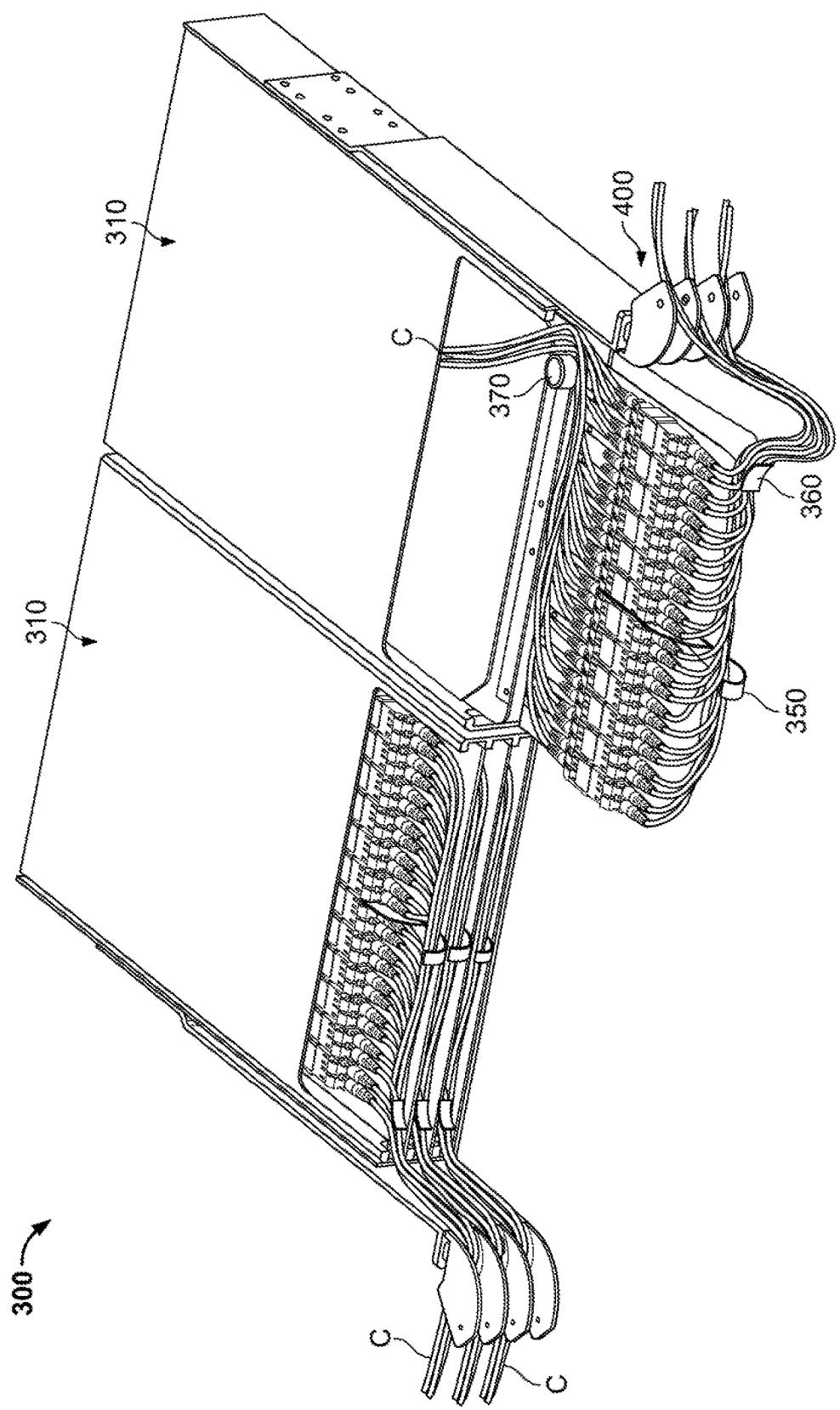
FIG. 7 is a perspective view of the cable management system of FIGS. 4A-C showing additional cable routing features.

FIG. 7 illustrates additional features which may help organize cables C of cable management system 300. In FIG. 7, one tray 331 on the right side is shown in the pulled out position, with one set of front cables C passing through cable guide 400, and a set of rear cables C passing rearward into the housing 2. Generally, it is desirable for the front cables C to pass laterally along a path prior to passing through the cable guide 400. In order to facilitate such routing, a handle member 350 may be provided on tray 331, the handle member extending proximally of the housing 2. The handle member 350 may take any suitable form that acts as a guide for cables C. For example, as illustrated, handle member 350 may include a substantially flat bottom surface which curves upward at the front end to provide surfaces against which cables C may be positioned. Additional surfaces may be provided on handle member 350, and desirably the surfaces include at least a bottom surface and front surface. Handle member 350 may provide the additional function of providing a user a convenient gripping member for pulling tray 331 out of the housing 2 or pushing tray 331 back into the housing. A lateral guide member 360 may also be provided at a lateral-most end of tray 331 to provide additional guidance to the cables C as they extend laterally away from tray 331. As illustrated, lateral guide member 360 has a convex cable contacting surface, although other shaped surfaces may be suitable. Additional guide members, such as rear guide member 370, may be provided on tray 331 to facilitate maintaining the rear cables in a desired position. The handle member 350 and/or guide members 360, 370 may also provide locking functionality. For example, when tray 331 is in the stored position, it may be desirable to maintain the tray 331 in a locked or semi-locked state so that intentional pulling force must be applied to tray 331 in order to begin transitioning the tray 331 into the pulled out position. This locking functionality may be provided, for example, by including detents or other cooperating structures in the housing 2 or adjacent trays 331 so that, when the tray 331 is in the stored position, one or more of the handle member 350 and guide members 360, 370, have a friction fit with the corresponding structure.

Figure 8A:
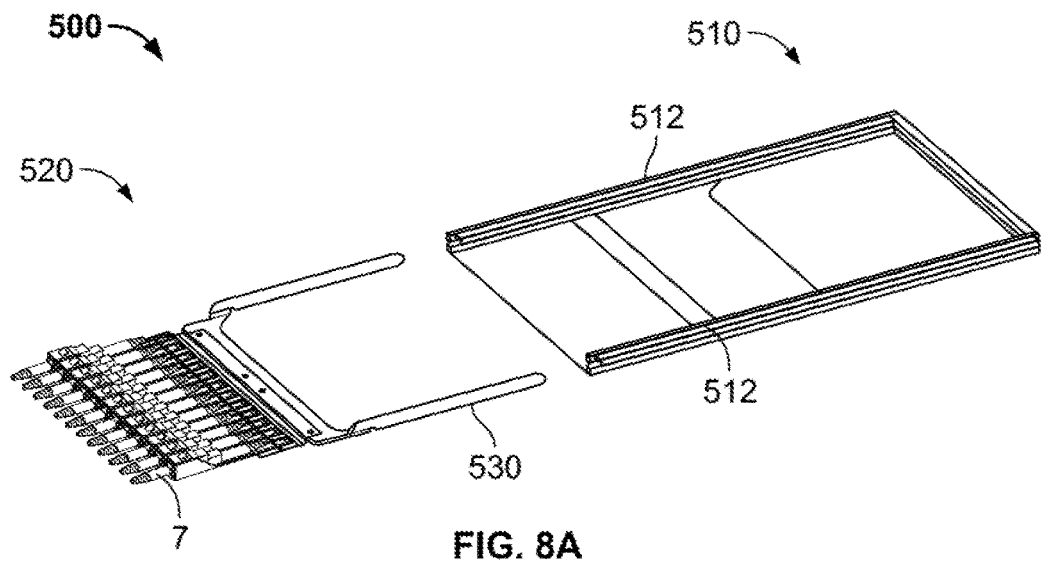
FIG. 8A is an exploded view of a cassette for use in a cable management system.

The patch panel devices 310 described above may take the form of sliding trays 331 mounted within, and slidable with respect to, a housing 2 or chassis. In other embodiments, substantially self-contained cassettes may be utilized, the cassettes being capable of being swapped into or out of a chassis, with the cassettes providing the sliding function entirely. For example, a cassette 500 is shown in an exploded view in FIG. 8A. The cassette 500 generally includes a cassette housing 510, which may be a substantially rectangular box with an open front, and a cassette head portion 520 slidable into and out of the housing 510. The sides of cassette housing 510 may include rail slots 512 to facilitate sliding of the cassette head 520, as described in greater detail below.

Figure 8B:
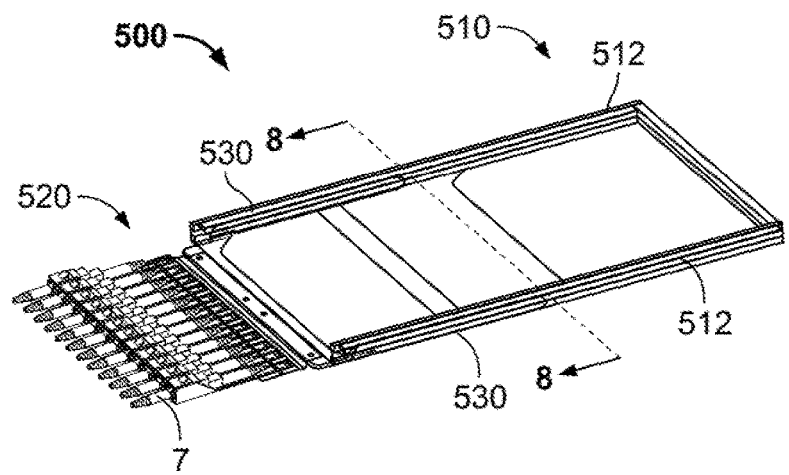
FIG. 8B is a perspective view of the cassette of FIG. 8A in a first state.
Figure 8C:
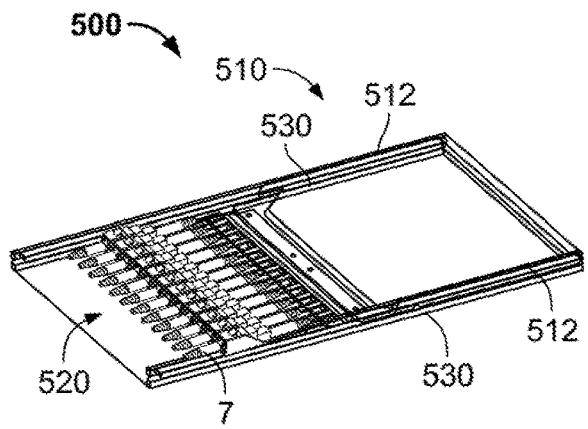
FIG. 8C is a perspective view of the cassette of FIG. 8B in a second state.

A front of cassette head 520 includes a plurality of ports 7 arranged in a similar or identical fashion as described in relation to patch panel 310, for example with laterally pivotable ports 7. Extending from each side of the rear of cassette head is a rail 530 for sliding into or out of the rail slots 512 of cassette housing 510. FIG. 8B illustrates cassette 500 with cassette head 520 in the pulled out position in which ports 7 may be easily accessed and may move in relation to one another in the same fashion as described above in connection with patch panel 310. FIG. 8C illustrates cassette 500 with cassette head 520 in the stored condition, the cassette head 520 being completely or substantially completely contained within cassette housing 510.

Figure 8D:
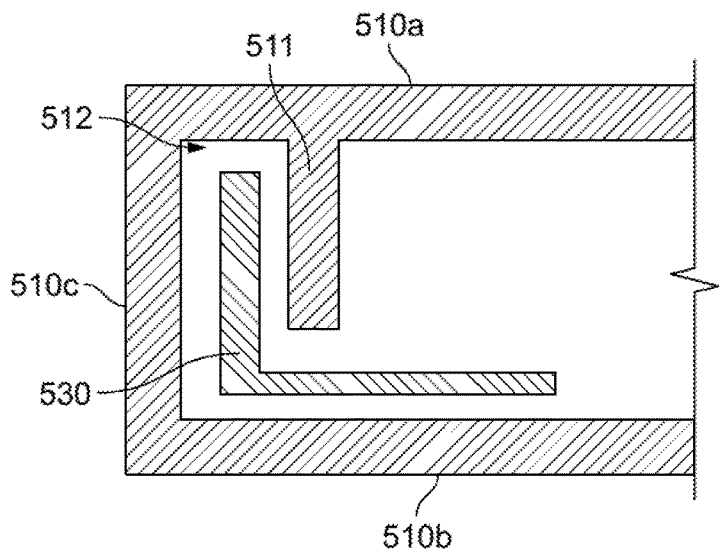
FIG. 8D is a cross-section of a portion of the cassette of FIG. 8A at line 8-8 indicated on FIG. 8B.
Figure 8E:
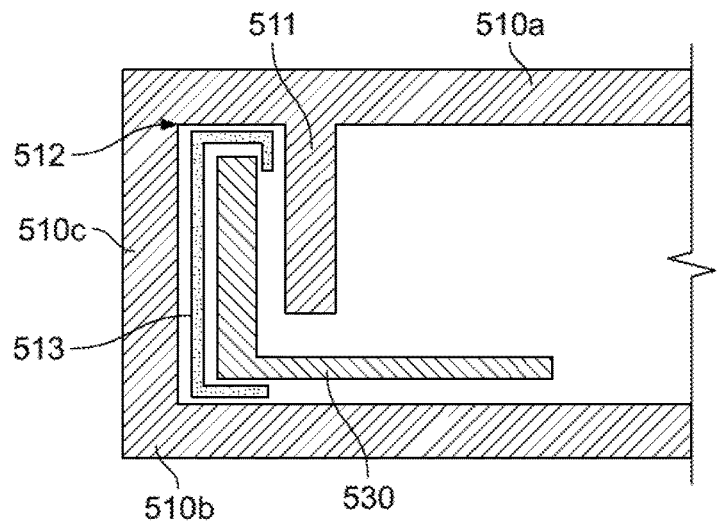
FIG. 8E is a cross-section of the portion of the cassette shown in FIG. 8D with an insert component provided therein.

FIG. 8D shows a cross section of one side of cassette housing 510 with rails 530 of cassette head 520 positioned therein, to illustrate the mechanism that provides sliding motion between cassette housing 510 and cassette head 520. In particular, a portion of top housing 510*a*, bottom housing 510*b*, and a sidewall 510*c* of housing 510 are shown in FIG. 8D. An extension 511 extends from top housing 510*a* toward bottom housing 510*b*, although not the entire distance therebetween. The extension 511, sidewall 510*c*, and portions of top housing 510*a* and bottom housing 510*b* define rail slot 512, in which a rail 530 of cassette housing is secured. As cassette head 520 is pulled out of or pushed into cassette housing 510, the interaction of the rails 530 in rail slots 512 help keep the cassette head 520 in a desired orientation and facilitate the sliding motion. Stops may be included, if desired, so that rails 530 are unable to unintentionally completely exit cassette housing 510, so that a user does not unintentionally decouple the cassette head 520 from the cassette housing 510 as it is transitioned to the pulled out position. Although on example of rails 530 and rail slots 512 are illustrated in FIG. 8D, other similar structures of rails and rail slots may be used to achieve the same result. As shown in FIG. 8E, an insert 513 may be positioned within rail slot 512. The insert 513 may be any desirable material and extend along substantially the entire length of the rail slot. The insert 513 may have a first stop to prevent the insert 513 from sliding out of the rail slot 512, and a second stop so that the rail 530 of the cassette head 520 is stopped from sliding out of the insert. With this configuration, the insert 513 may extend the length which cassette head 520 may slide with respect to cassette housing 510. In addition, the material and dimensions of insert 513 may be chosen to provide for smoother sliding between cassette head 520 and cassette housing 510. For example, if rail 530 and rail slot 512 are both metal, a plastic insert 513 may provide for smoother sliding. To provide for extending the length which cassette head 520 may slide with respect to cassette housing 510, it may be preferable for insert 513 to be formed of a hard metal.

Figure 9A:
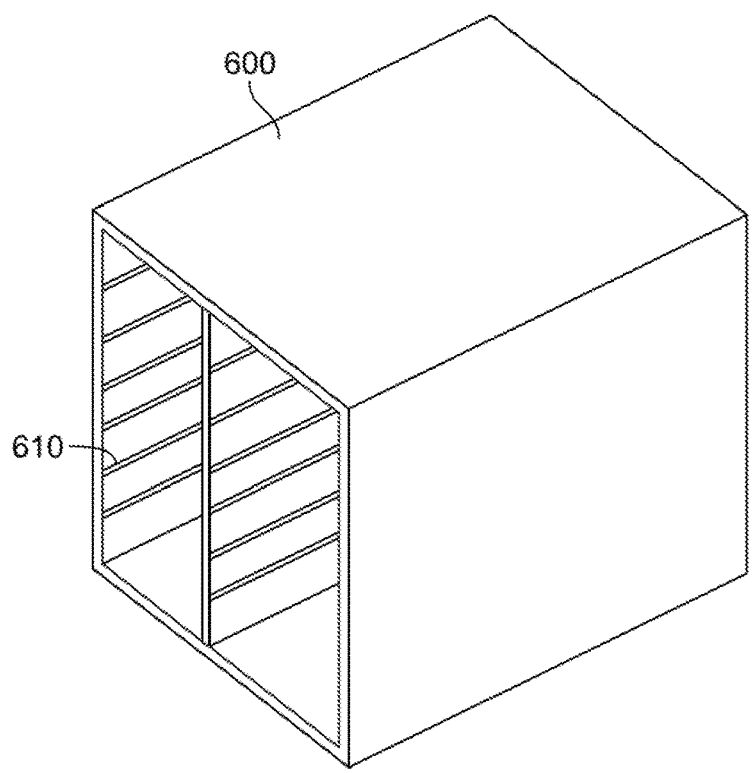
FIG. 9A is a perspective view of a chassis for use with cassettes such as that shown in FIG. 8A.
Figure 9B:
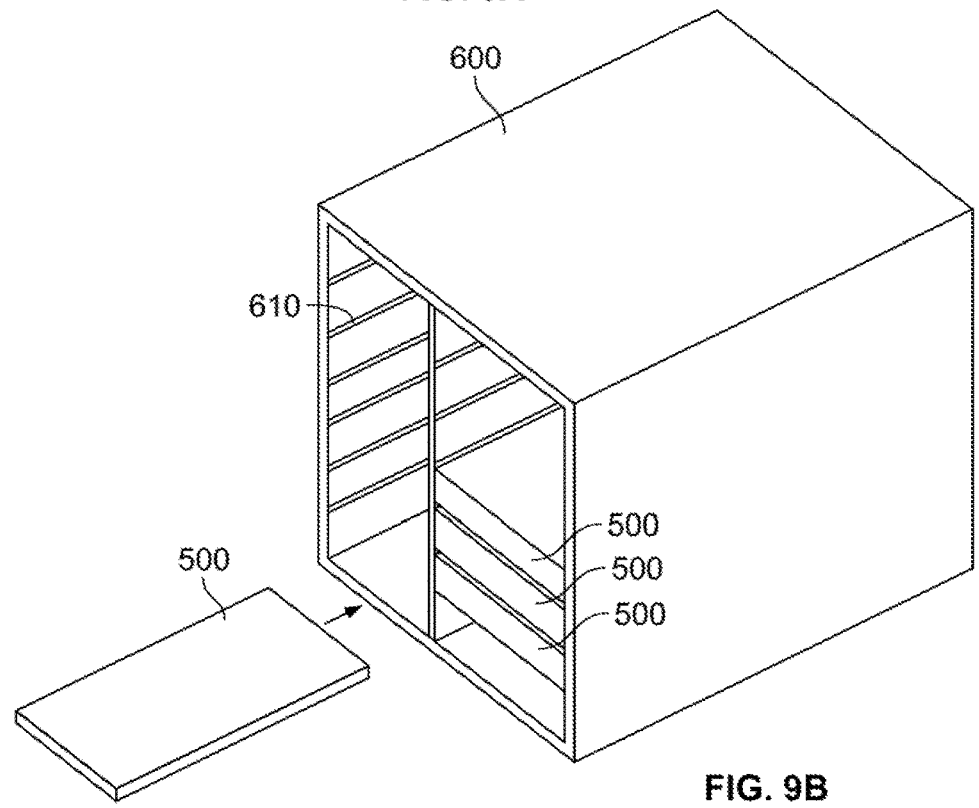
FIG. 9B is a perspective view of the chassis of FIG. 9A with cassettes positioned therein.

Cassette 500 may be modular in the sense that it may be inserted into a chassis and, if for example a cassette is damaged, it may be easily removed from the housing and replaced with another. For example, FIG. 9A shows a chassis 600 that may be used to hold a plurality of cassettes 500. In the illustrated embodiment, chassis 600 includes two vertical channels for accepting cassettes 500, each channel having a plurality of supports 610 to support cassettes 500. FIG. 9B shows chassis 600 with three cassettes 500 installed and one cassette 500 in the process of being installed. Any of the cable guides 400 described above, or modifications thereof, may provide cable slack management functionality for the cassette version of the system as the patch panel versions described above. For example, one or more mounting arms 410 of cable guides 400 may be coupled to the chassis 600 so that cables connected to ports in a cassette 500 may be managed as the cassette head 520 slides relative to the cassette housing 510. In addition, because the cassette housing 510 is stationary with respect to the chassis 600, the mounting arm 410 of a cable guide 400 may be coupled directly to the cassette housing 510. Since the cassette housing 510 remains stationary with respect to the cassette head 520, as the cassette head 520 slides into or out of the cassette housing 510, the cable guide 400 remains stationary despite being fixed to the cassette housing.

Figure 10A:
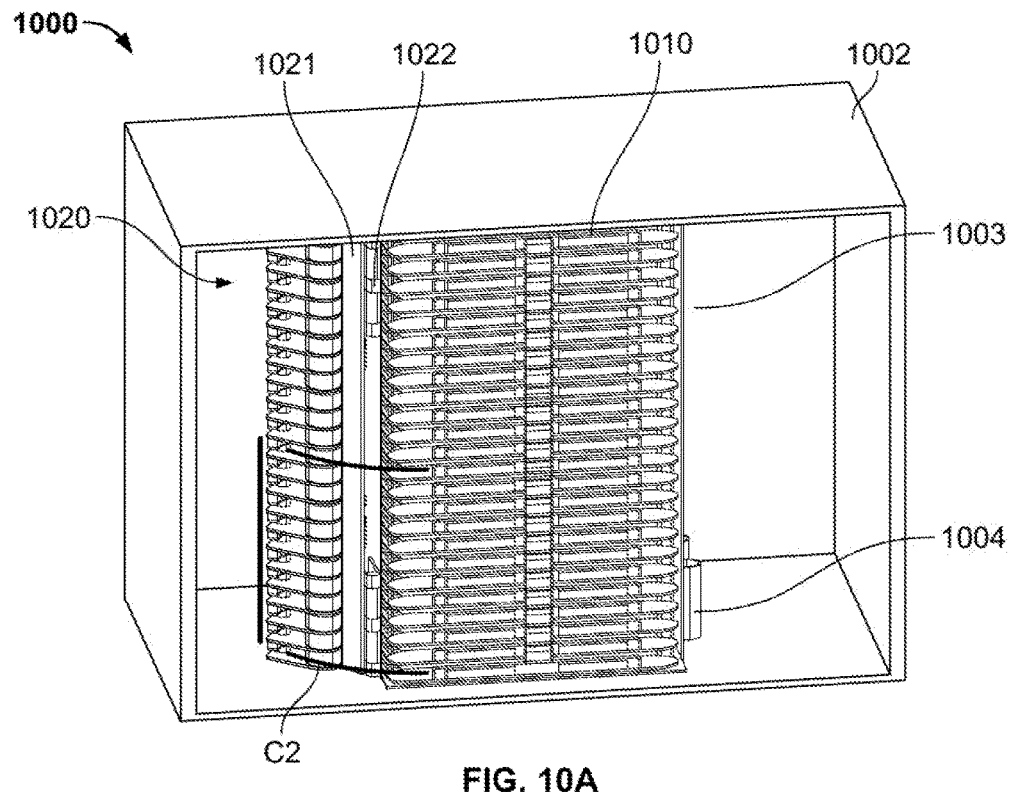
FIGS. 10A-B are perspective and top views, respectively, of a patch panel system with a hanger plate assembly in a stored condition.
Figure 10B:
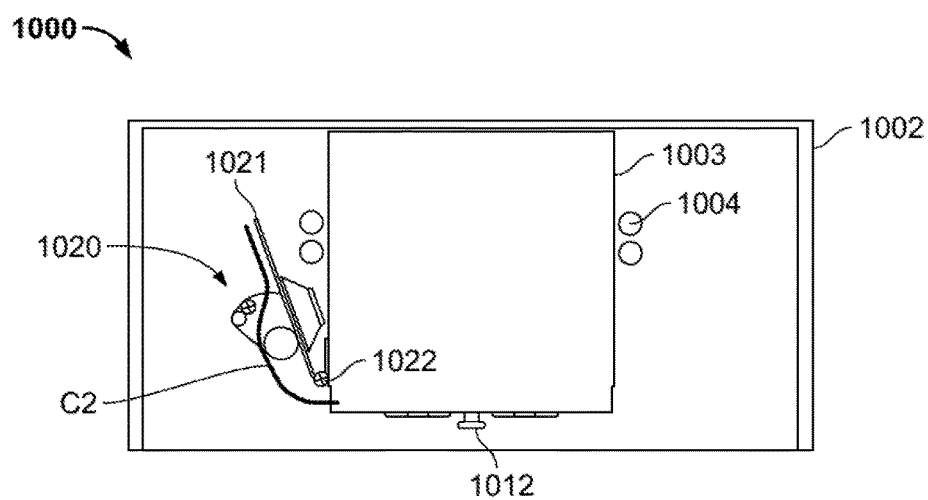

FIG. 10A shows a perspective view of a patch panel system 1000 according to another embodiment of the disclosure. Patch panel system 1000 may include an outer housing 1002 with side walls, top and bottom walls, a distal or rear wall, and an open front or proximal face. However, a proximal cover, such as a door or other cover that allows access inside the outer housing 1002, may be used in conjunction with the outer housing although such a cover is not shown in the figures. FIG. 10B shows a top view of patch panel system 1000 with the top wall of outer housing 1002 omitted for clarity of illustration. An inner housing 1003 may be positioned within outer housing 1002, preferably completely within the boundaries of the outer housing 1002. The inner housing 1003 may include side walls, and top, bottom and rear walls that may be integral with corresponding walls of the outer housing 1002, or which may be separate and distinct from the walls of the outer housing. Inner housing 1003 may include a plurality of slots stacked in a vertical arrangement, similar to the supports 610 of the chassis 600 of FIG. 9A. Each slot is adapted to hold a tray or cassette 1010 in sliding engagement with the slot, although in practice every slot may not necessarily have a cassette 1010 received therein. Each cassette 1010 may be generally similar to patch panel devices 110, 210, 310 and/or cassettes 500 described above, the cassettes 1010 including ports or other connectors to connect to cables. Each cassette 1010 may include a handle 1012 extending from a proximal end to provide a grip for a user to pull the cassette 1010 out of the inner housing 1003, for example into the position shown in FIGS. 10G-H, for easy access to the cassette(s) 1010 of interest. Outer housing 1002 may include one or more access ports 1004 to allow for cables or other items to pass between the inside and the outside of the outer housing. As shown in FIG. 10A, access ports 1004 may take the form of cylindrical members that may be integral with the bottom wall of outer housing 1002, although any opening that allows cables to pass from outside to inside the outer housing 1002 (or vice versa), may be suitable.

In one example, patch panel system 1000 may be used to patch connections from a vendor, such as a cable provider, to a customer, such as an apartment complex or individual units thereof. The outer housing 1002 may be particularly suited to be used outside, with the outer housing 1002 providing protection from the elements to the components within the outer housing 1002, including the inner housing 1003. For such a use, cables from the vendor may enter through access ports 1004 on one side of outer housing 1002, for example the right side, and connect to ports in the rear of one or more cassettes 1010. Other cables may extend from the rear of one or more cassettes 1010, through corresponding access ports 1004 for example on the left side of the outer housing 1002, to individual units within the apartment complex to provide connection between the individual customer and the vendor. Patch panel system 1000 may provide a convenient system for operating and maintaining the connections between the vendor and the individual customers, for example, with one or more cables C2 extending from and connecting a front or proximal side of one cassette 1010 in inner housing 1003 to the front of another cassette in the inner housing.

Figure 10C:
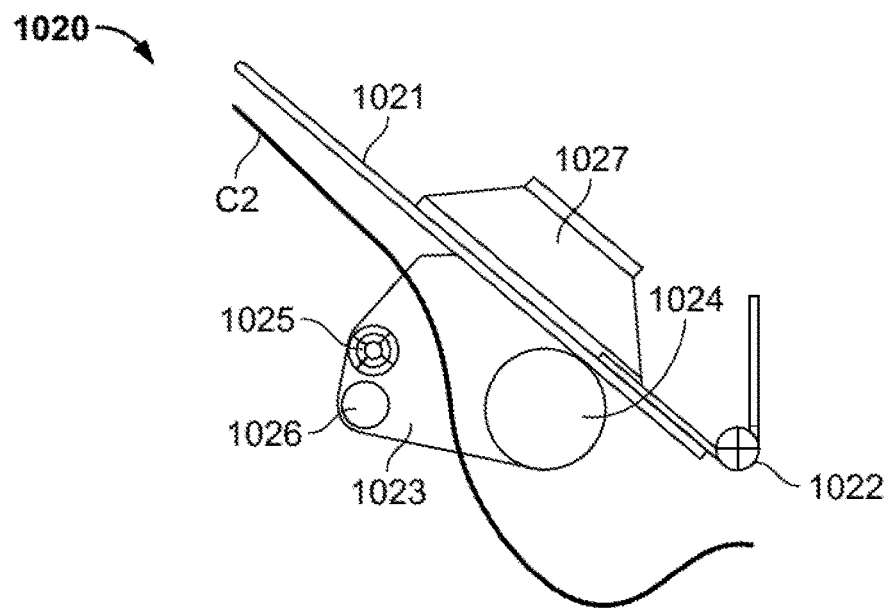
FIG. 10C is a top view of the hanger plate assembly of FIG. 10A.
Figure 10D:
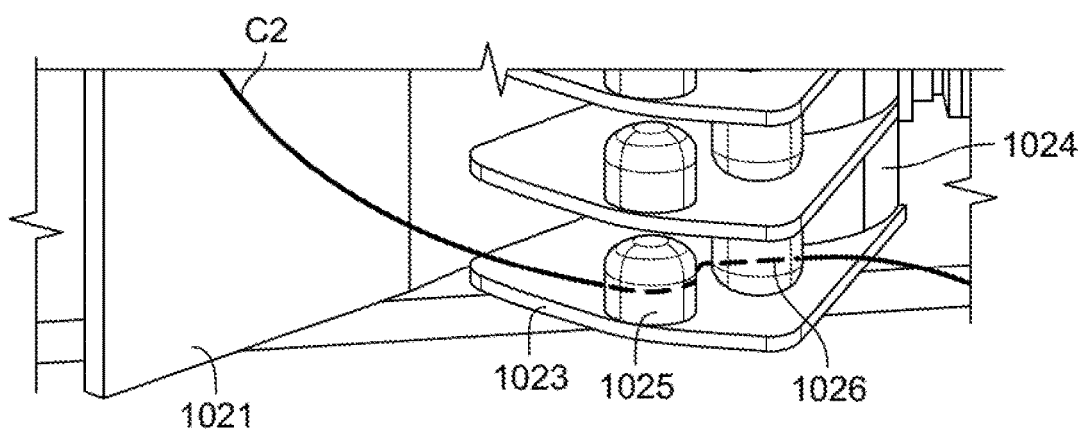
FIG. 10D is an enlarged perspective view of a portion of the hanger plate assembly of FIG. 10A.
Figure 10E:
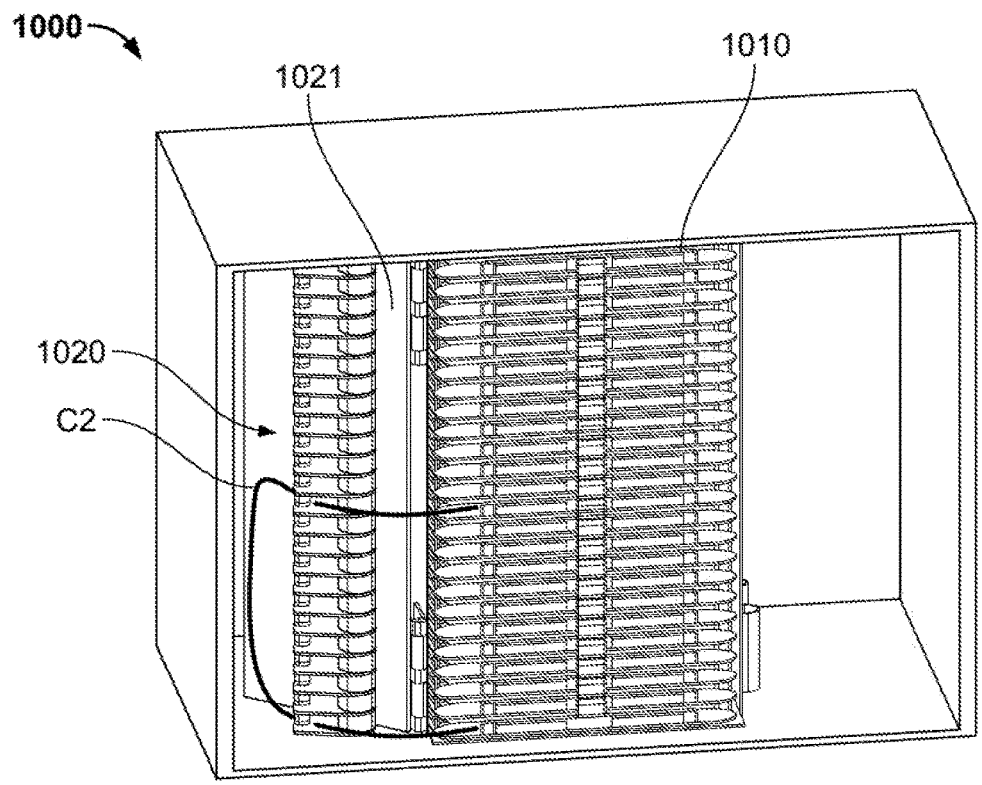
FIGS. 10E-F are perspective and top views, respectively, of the patch panel system of FIG. 10A with the hanger plate assembly in an intermediate position.
Figure 10F:
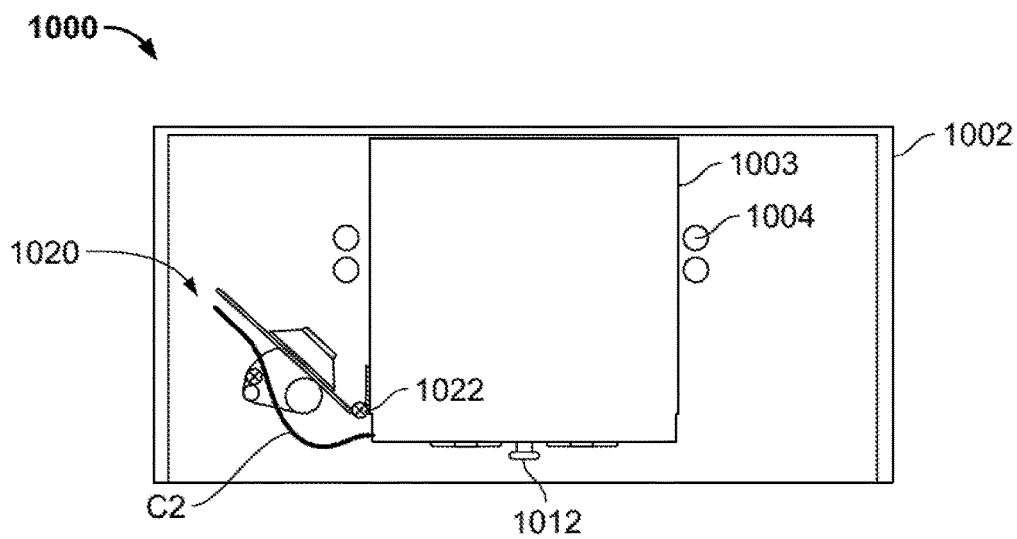
Figure 10G:
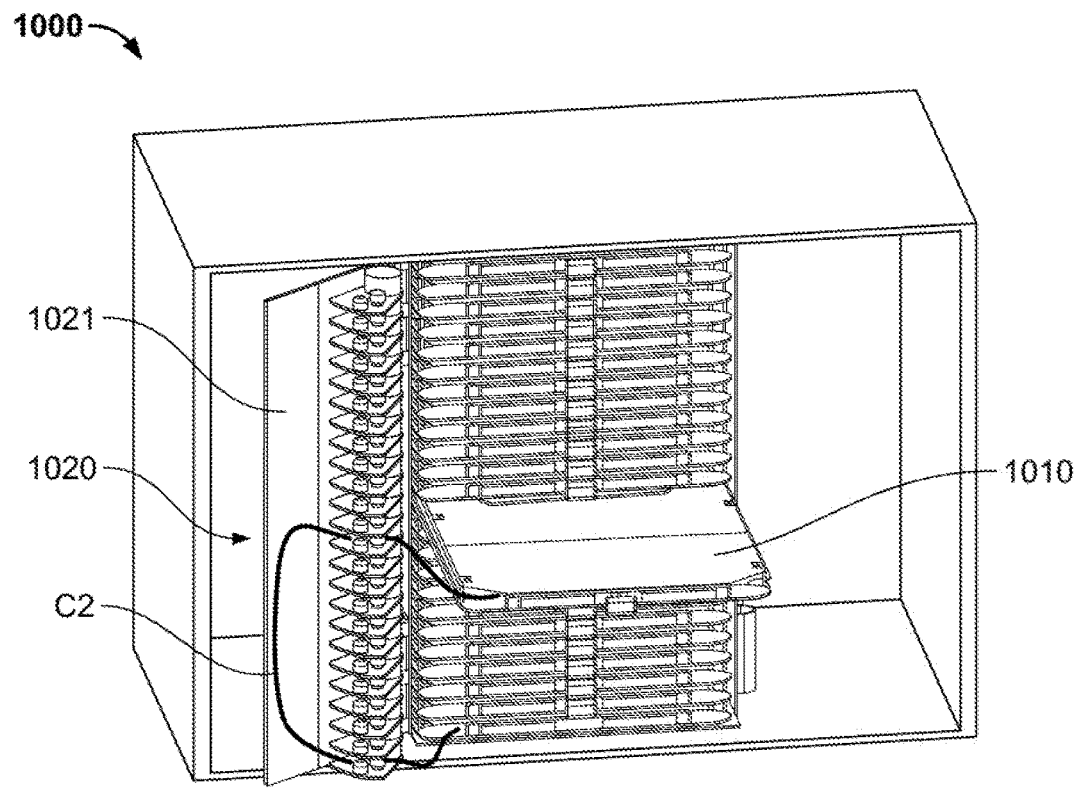
FIGS. 10G-H are perspective and top views, respectively, of the patch panel system of FIG. 10A with the hanger plate assembly in a pulled out condition.
Figure 10H:
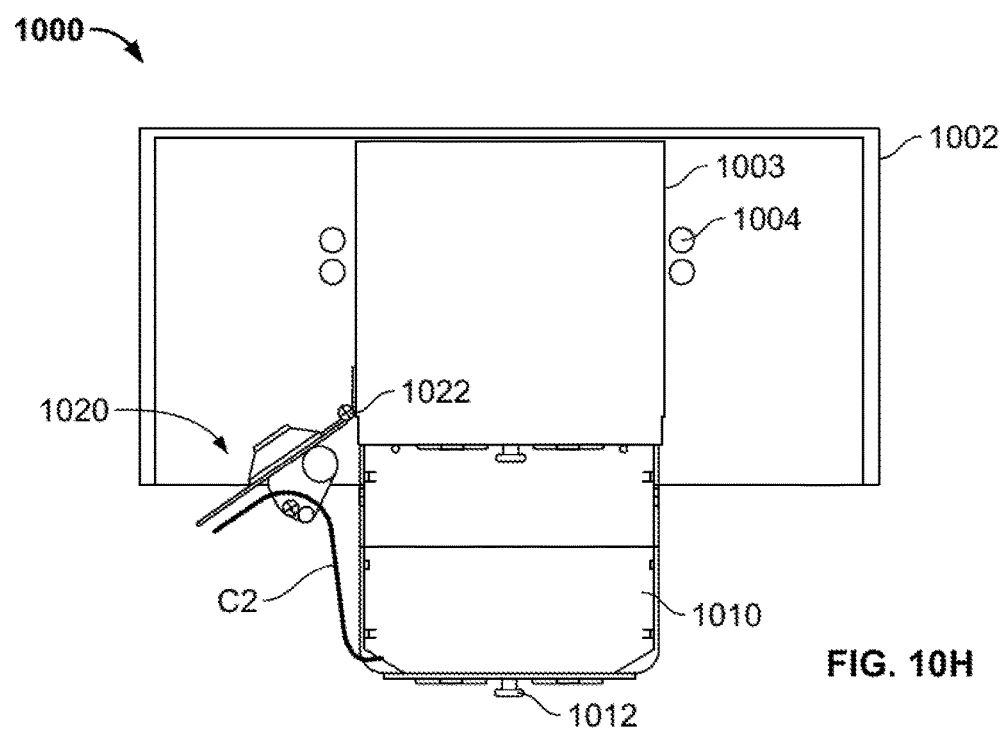

Although FIGS. 10A-H show a single cable C2 connected between the front ends of two cassettes 1010, in practice many cables C2 could be connected between the fronts of pairs of cassettes 1010. In such a situation, management of these cables C2 may become difficult, particularly when a user needs to access a particular cable or cables C2. To assist in the management of cables connected to patch panel system 1000, the patch panel system 1000 may include a pivotable hanger plate assembly 1020. Hanger plate assembly 1020 may include a hanger plate 1021 which may, for example, be a rigid rectangular plate coupled to a side wall of inner housing by one or more hinges 1022. Hanger plate 1021 preferably has a height that is less than the distance between the bottom and top walls of the outer housing 1002, and a width that is smaller than the distance between the side walls of the outer and inner housing between which the hanger plate 1021 is positioned. With this configuration, hanger plate 1021 may swing with a range of motion about hinge(s) 1022 from being positioned inside the outer housing 1002 as shown in FIGS. 10A-B, through a transition position shown in FIGS. 10E-F, to a position outside the outer housing 1002 as shown in FIGS. 10G-H.

Enlarged top and isolated perspective views of the hanger plate assembly 1020 are shown in FIGS. 10C-D. A plurality of hangers 1023 may be coupled to proximal face of hanger plate 1021. Each hanger 1023 may include a substantially flat surface on which a cable C2 may rest. A guide surface 1024 may be positioned on one end of the hanger 1023. Guide surface 1024 is illustrated as having a circular cross-section. Although guide surface 1024 does not need to have a circular cross-section, it preferably includes a curvature that provides a minimum bending radius which restricts cable C2 from bending so much that cable C2 becomes damaged. As best seen in FIG. 10G, guide surface 1024 may be a formed by a single cylindrical member extending substantially the entire height of the hanger plate 1021. However, it should be understood that a separate guide surface 1024 may be provided for each individual hanger 1023 if desired.

Each hanger 1023 may also be associated with one or more retaining members to help keep cable C2 positioned within hanger 1023. For example, each hanger 1023 may include an upwardly extending retaining member 1025 extending upwardly from the flat surface of the hanger 1023. As best seen in FIG. 10D, upwardly extending retaining member 1025 may be substantially cylindrical and extend upwards toward a vertically adjacent hanger 1023, without contacting the vertically adjacent hanger 1023. Similarly, each hanger 1023 may also include a downwardly extending retaining member 1026 extending downwardly from the flat surface of the hanger 1023. As best seen in FIG. 10D, downwardly extending retaining member 1026 may be substantially cylindrical and extend downwards toward a vertically adjacent hanger 1023, without contacting the vertically adjacent hanger 1023. With this configuration, the space between two vertically adjacent hangers 1023 includes two retaining members 1025, 1026 that may keep a cable C2 from unintentionally exiting the space between the two vertically adjacent hangers 1023. However, like the fins 430 described in connection with FIG. 6A, space is provided between the ends of the retaining members 1025, 1026 and the flat surfaces of the hangers 1023 so that a user may remove (or insert) cable C2 from the space between vertically adjacent hangers 1023 by manually removing (or inserting) the cable C2 through the space between the retaining members 1025, 1026 and the surfaces of the hangers 1023. It should be understood that in a set of vertically stacked hangers 1023, the bottom-most hanger 1023 need not include a downwardly extending retaining member, and the top-most hanger 1023 need not include an upwardly extending retaining member.

Hanger plate assembly 1020 may also include a rear hanger 1027 coupled to and extending from the rear of hanger plate 1021, extending in an opposite direction than hangers 1023. Preferably, only a single rear hanger 1027 is coupled to the rear of hanger plate 1021 at a top of the hanger near the top surface of the outer housing 1002. However, more rear hangers 1027 may be included if desired, including for example a second rear hanger 1027 at the bottom of hanger plate 1021, or in any other number and position as desired. Rear hanger 1027 may include a flat bottom surface between two upwardly extending surfaces that create a generally "U"-shaped channel. Cables that connect to the rear of the cassettes 1010 and exit through an access port 1004 may be bundled together and be partially routed along the "U"-shaped channel of rear hanger 1027 to help maintain those cables in an organized condition, reducing the likelihood those cables will interfere with cables C2 in the front portion of outer housing 1002 or with the swinging movement of hanger plate assembly 1020. It should be understood that cables entering the outer housing 1002 through an access port 1004 and coupled to the rear of one or more cassettes 1010 may also be routed along the "U"-shaped channel of rear hanger 1027 for similar reasons. One or more apertures (not illustrated) may be provided in the hanger plate 1021 between the rear hanger 1027 and a hinge 1022 so that a bundle of cables positioned within the rear hanger 1027 may pass through the hanger plate 1021 and enter the inner housing 1003 so they may connect to corresponding ports, such as those in the rear of particular cassettes 1010. In some embodiments, the rear of the cassettes 1010 may be accessible by an opening, provided by a door or other mechanism, so that cables entering through access ports 1004 may connect directly to the rear of cassettes 1010 where desired, without passing those cables through hanger plate 1021.

Operation of the patch panel system 1000 with respect to the organization of cables is described briefly. In a stored state, cables entering or exit outer housing 1002 through access ports 1004 on the left side of the outer housing and connecting to the rear of cassette may be secured within the "U"-shaped channel of rear hanger 1027. Cables C2 extending from the front of cassettes 1010 to the front of other cassettes 1010 may each extend through a first hanger 1023 positioned adjacent the corresponding cassette 1010, guided along guide surface 1024 to maintain a minimum bend, resting on the flat surface of hanger 1023, and being maintained between vertically adjacent hangers 1023 by retaining members 1025, 1026. The particular cable C2 may exit the space between vertically adjacent hangers 1023 between the retaining members 1025, 1026 and the hanger plate 1021. After exiting, the cable C2 may extend up or down generally along the hanger plate 1021, and enter the space between a different pair of vertically adjacent hangers 1023, where the cable C2 may then couple to the front of a separate cassette 1010. In the stored position, as shown in FIGS. 10A-B, the hanger assembly 1020 may be rotated about hinge 1022 so that the hanger plate 1021 extends toward the rear wall of outer housing 1002. In this position, the cables C2 may have little to no slack. If a user desires to access one or more cassettes 1010 and cables C2 to, for example, perform maintenance, the user can open a door on the front of outer housing 1002, if such a door is included. Before pulling out a cassette 1010, the slack in cables C2 may be increased. The user may begin to increase the slack in cables C2 by grasping a portion of the hanger plate assembly 1020, for example the hanger plate 1021 or any of the hangers 1023, and beginning to pull the hanger assembly proximally as shown in FIGS. 10E-F. As the hanger plate assembly 1020 continues to rotate about hinge 1022, the hanger plate 1021 and the associated hangers 1023 continue to rotate until the hanger plate 1021 exits the front of outer housing 1002, as seen in FIGS. 10G-H. With the hanger plate assembly 1020 rotated at least partially out of outer housing 1002, the slack in cables C2 is further increased. The user may then pull one or more cassettes 1010 proximally out of the outer housing 1002, which may be facilitated by use of handle(s) 1012. As the cassette 1010 is pulled out, slack in the cables C2 may begin to increase as the proximal face of the cassette 1010 is aligned with the retainer members 1025, 1026. As the cassette 1010 is pulled out further to a proximal distance from the housing 1002 greater than the retainer members 1025, 1026, the slack in the cables C2 may begin to decrease again. Preferably, when the cassette 1010 is pulled out to the maximum extent, enough slack remains so that a user can easily manipulate the cables C2 at the corresponding ports, but not there is not so much slack that the cables C2 are difficult to manage. As shown in FIGS. 10G-H, the cables C2 and cassettes 1010 are easily accessible with both cables C2, and the cables resting on rear hanger 1027, maintained in an organized state. It should be understood that the patch panel system 1000 is not shown to scale in FIGS. 10A-H.

Figure 10I:
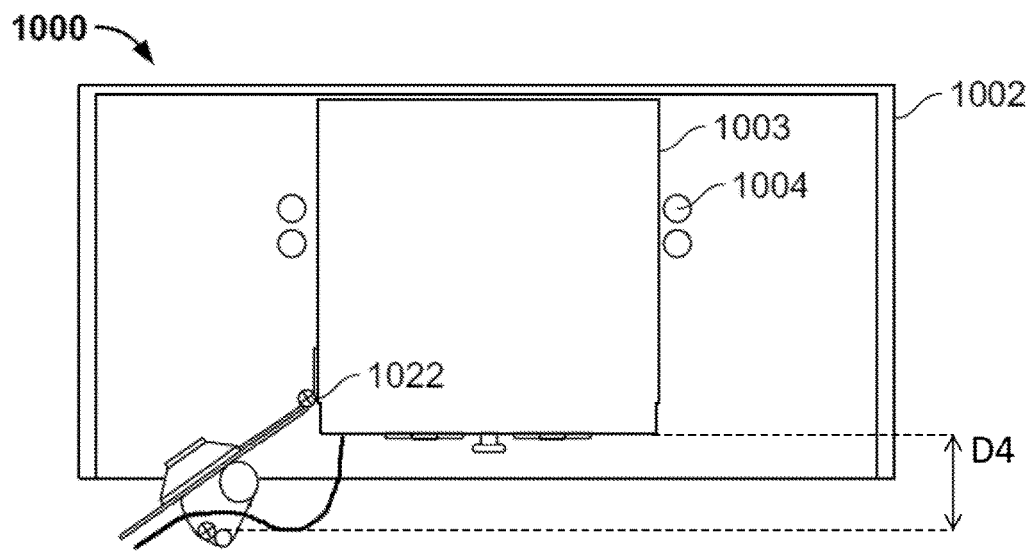
FIGS. 10I-J are top views of the patch panel system of FIG. 10A illustrating an exemplary installed configuration of components of the system.
Figure 10J:
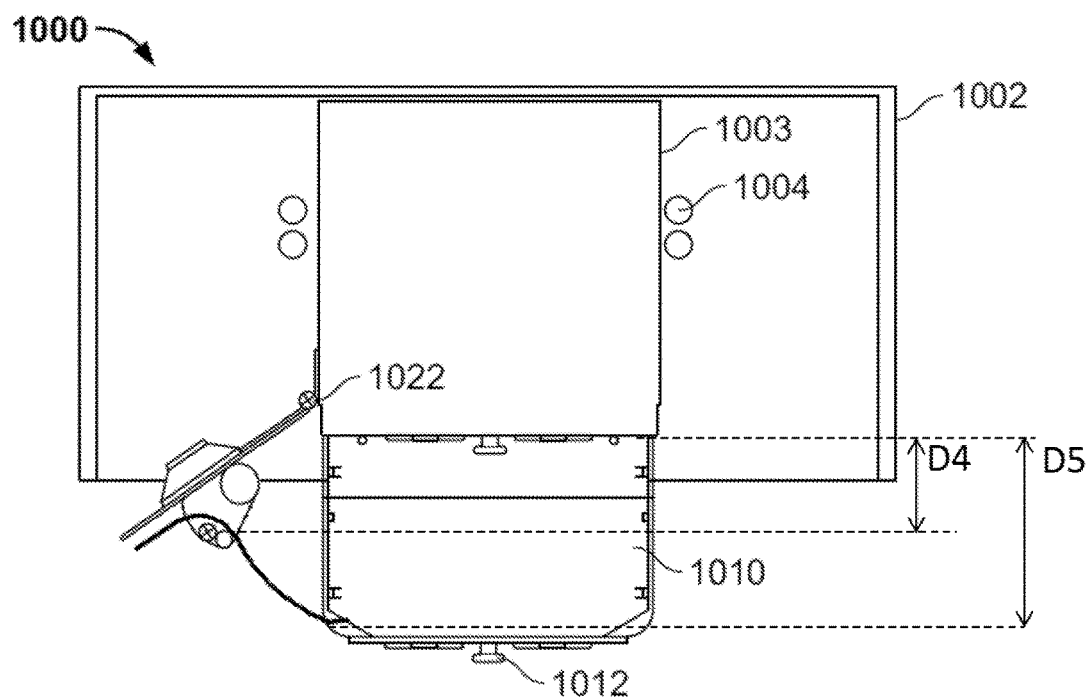

Referring now to FIGS. 10I-J, the positions of retaining members 1025, 1026 and guide surface 1024 may be selected in order to attain a desired slack management of cables C2 at all positions of hanger plate assembly 1020 and cassettes 1010. For example, referring to FIG. 10I, the retaining members 1025, 1026 may be positioned a distance D4 from the proximal face of inner housing 1003 when the hanger plate assembly 1020 is rotated out of the outer housing 1002. As the user pulls out cassette 1010, slack in the cables C2 may initially increase compared to that shown in FIG. 10I. Once the proximal face of cassette 1010 moves in the proximal direction past the position of the retaining members 1025, 1026, slack may begin to decrease again. As shown in FIG. 10J, the proximal face of each cassette 1010 has a maximum distance D5 from the proximal face of inner housing 1003 when the cassette 1010 is in the fully pulled out position. Preferably, the distance D5 is about twice the distance D4. With this configuration, when the hanger plate assembly 1020 is rotated out of the outer housing 1002 as shown in FIGS. 10I-J, cables C2 may have about the same slack when the cassette 1010 is in the stored position shown in FIG. 10I and when the cassette 1010 is in the pulled out position shown in FIG. 10J. However, in other embodiments, distance D5 may be less than twice D4, so that there is a net increase in the slack of cables C2 when the cassette 1010 is transitioned from the stored condition to the pulled out condition. Such an increase in slack may make it easier for a user to manipulate the connection of cables C2 with corresponding ports in cassette 1010. This feature is similar to the related feature described above in connection with FIG. 4B.

Although patch panel system 1000 is shown with a single hanger plate assembly 1020, it should be understood that patch panel system 1000 may include a second hanger plate assembly on the opposite side of inner housing 1003 of the first hanger plate assembly 1020. If a second hanger plate assembly is used, it may be identical to the first hanger plate assembly 1020 in structure and function, albeit the components would be in a mirrored position compared to the first hanger plate assembly 1020. Also, although the hanger plate assembly 1020 is shown with one hanger 1023 for each cassette 1010, more or fewer individual hangers 1023 may be provided. Still further, although hanger plate 1021 is shown as a single rigid member so that all of the hangers 1023 attached to the hanger plate 1021 move in unison, in other embodiments a plurality of individually rotatable hanger plates may be provided. For example, a hanger plate may be provided in two portions, so that a top group of hangers is separately rotatable with respect to a bottom group of hangers. Still further, any number of hanger plates, up to the total number of hangers so that each hanger may be individually rotatable, may be used. However, a single hanger plate 1021 may be preferable for ease of use.

As noted above, patch panel system 1000 may be suited for outdoor use. When being used outdoors, it may be important that when the patch panel system 1000 is not being actively used or maintained, the components are all capable of being situated within the bounds of the outer housing 1002, so that the components are protected from the elements. Thus, as noted above, the width of the hanger plate 1021 should be less than the distance between a side wall of the inner housing 1003 and the corresponding side wall of the outer housing 1002, so that it may swing from outside the outer housing 1002 to inside the outer housing 1002 where it is protected from the elements. However, it may be beneficial to provide a hanger plate that is wider than hanger plate 1021, so that cables C2 may be guided with fewer sharp turns, such as where a cable exits one hanger 1023 and moves down or up the hanger plate 1021 towards another hanger 1023. This may beneficial because certain cables used with patch panel system 1000 may be quite stiff, making tight turns difficult to maintain.

The patch panel system 1000' shown in FIGS. 11A-H addresses the potential limitations described immediately above. Patch panel system 1000' may be identical to patch panel system 1000 in most or all respects other than the hanger plate assembly 1020'. For example, patch panel system 1000' may include outer housing 1002, inner housing 1003, access ports 1004, and cassettes 1010 identical to those described in connection with FIGS. 10A-H. As such, these components will not be described in detail again.

Figure 11A:
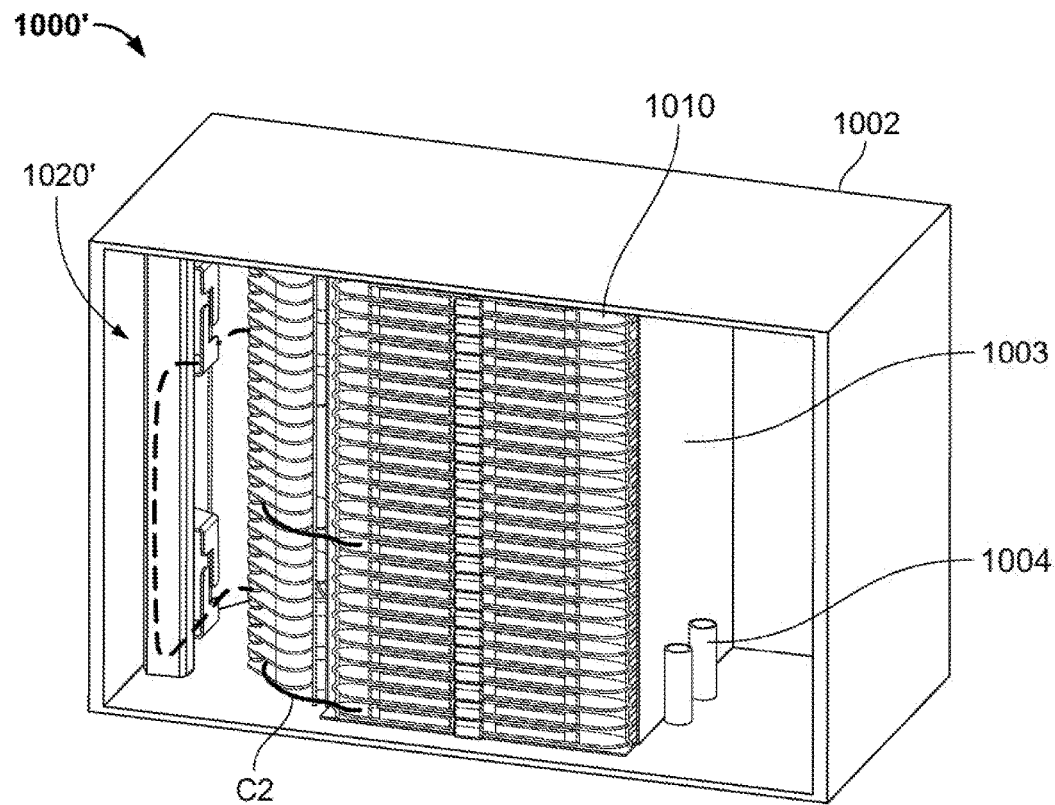
FIGS. 11A-B are perspective and top views, respectively, of a patch panel system with a hanger plate assembly in a stored condition according to an alternate embodiment.
Figure 11B:
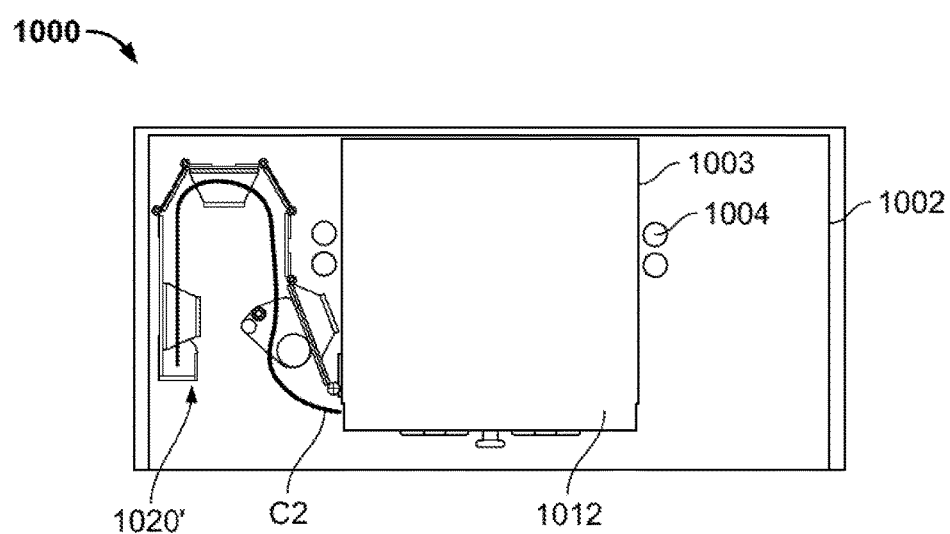
Figure 11C:
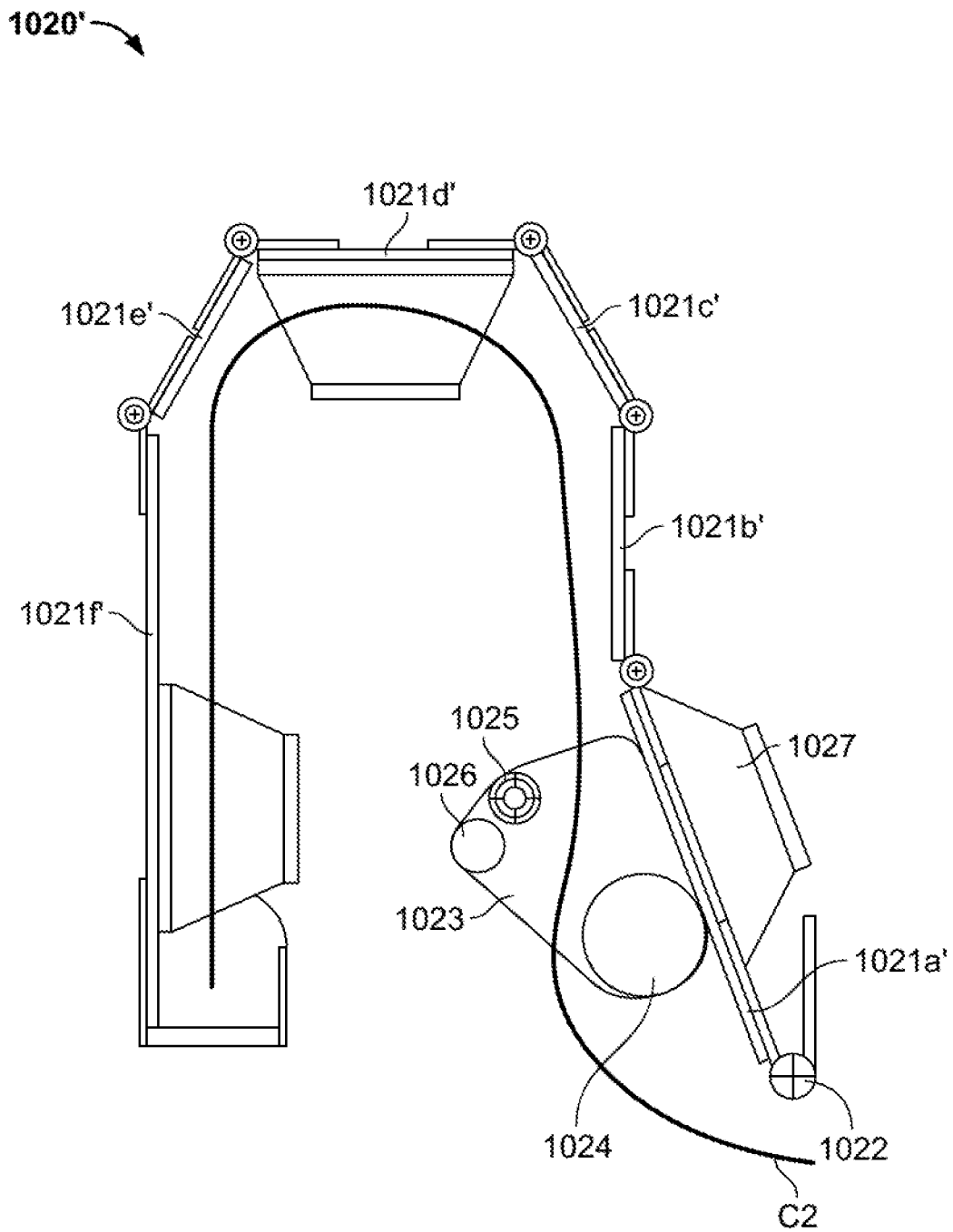
FIG. 11C is a top view of the hanger plate assembly of FIG. 11A in a stored condition.
Figure 11D:
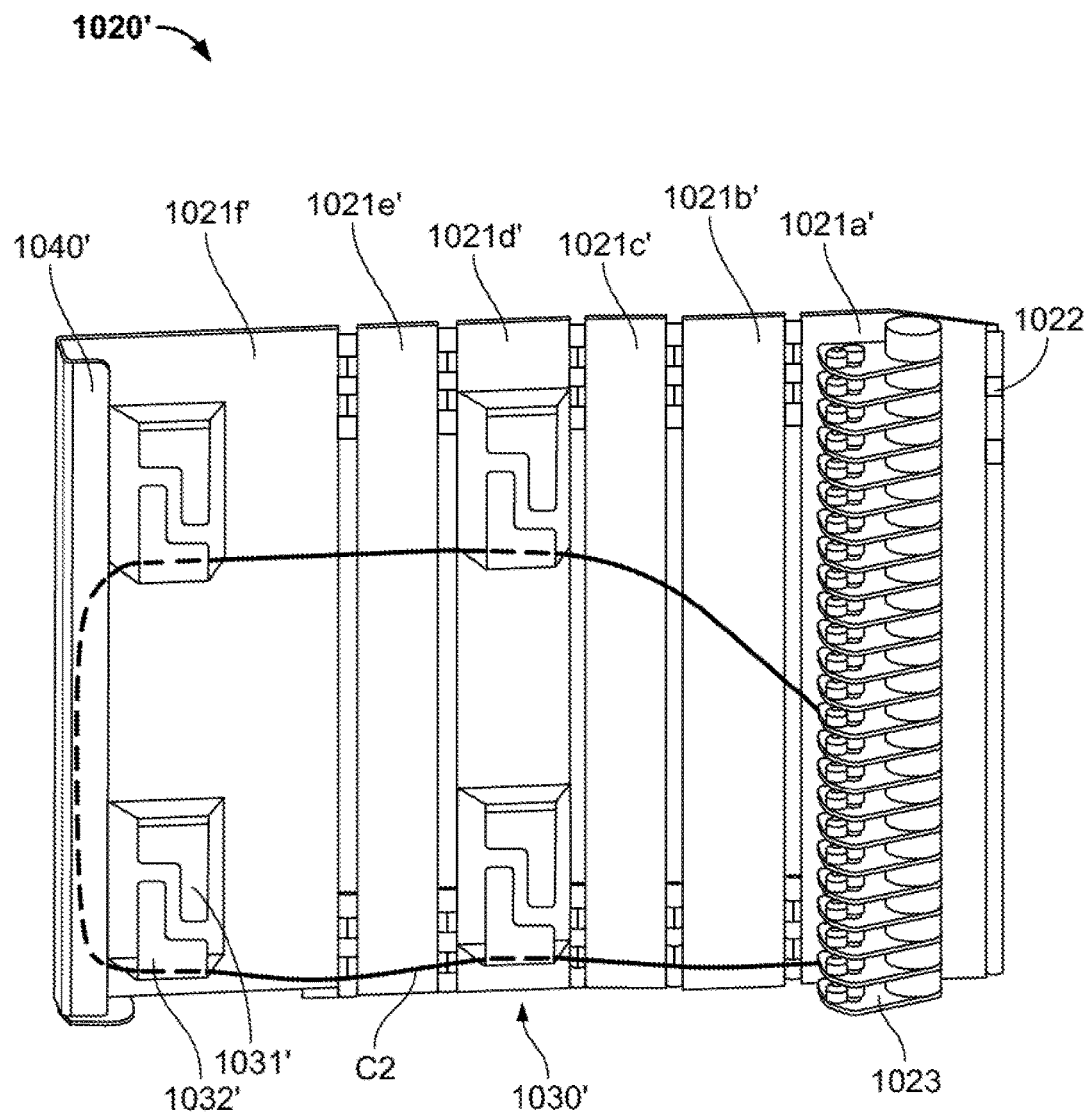
FIG. 11D is a perspective view of the hanger plate assembly of FIG. 11A in a pulled out condition.
Figure 11E:
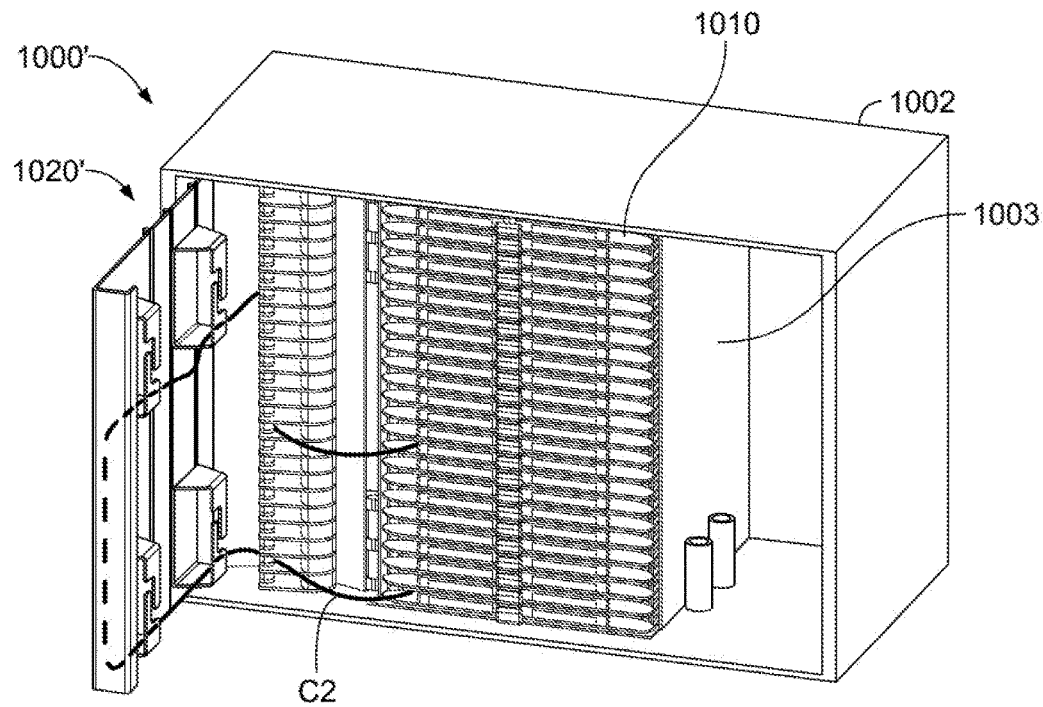
FIGS. 11E-F are top and perspective views, respectively, of the patch panel system of FIG. 11A with the hanger plate assembly in a transition position.
Figure 11F:
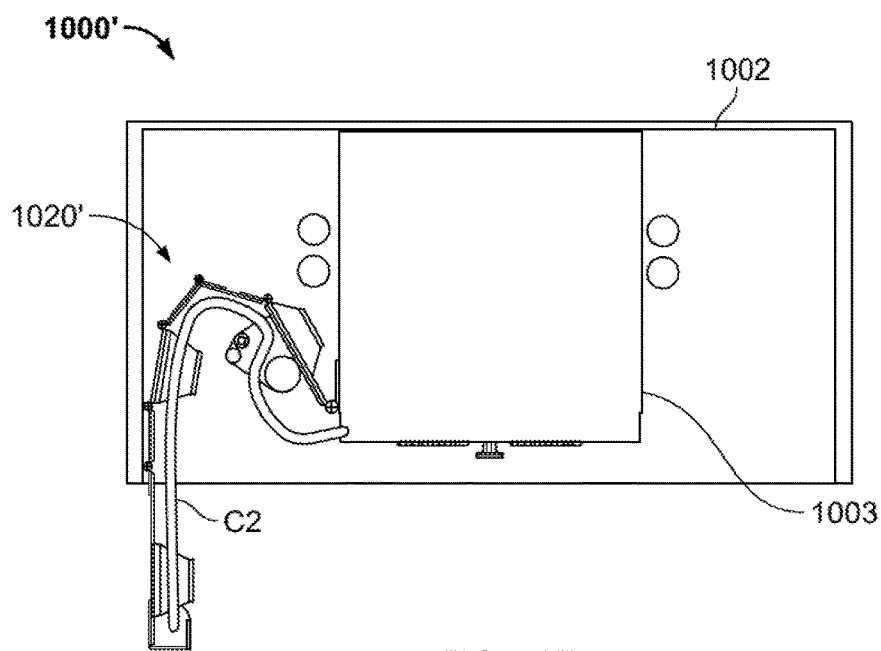
Figure 11G:
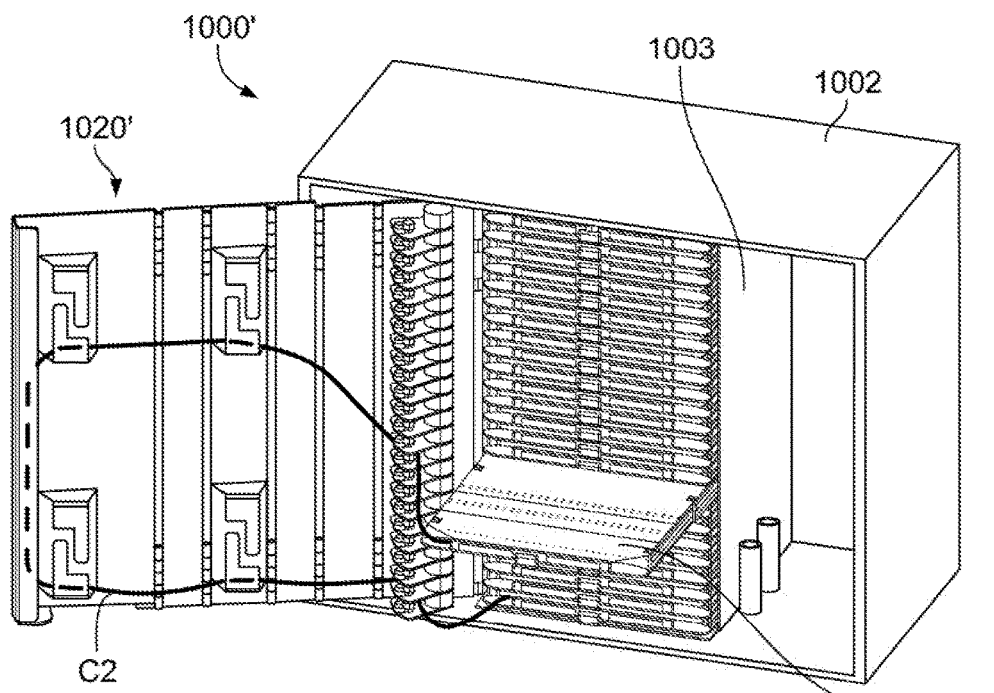
FIGS. 11G-H are top and perspective views, respectively, of the patch panel system of FIG. 11A with the hanger plate assembly in a pulled out condition.
Figure 11H:
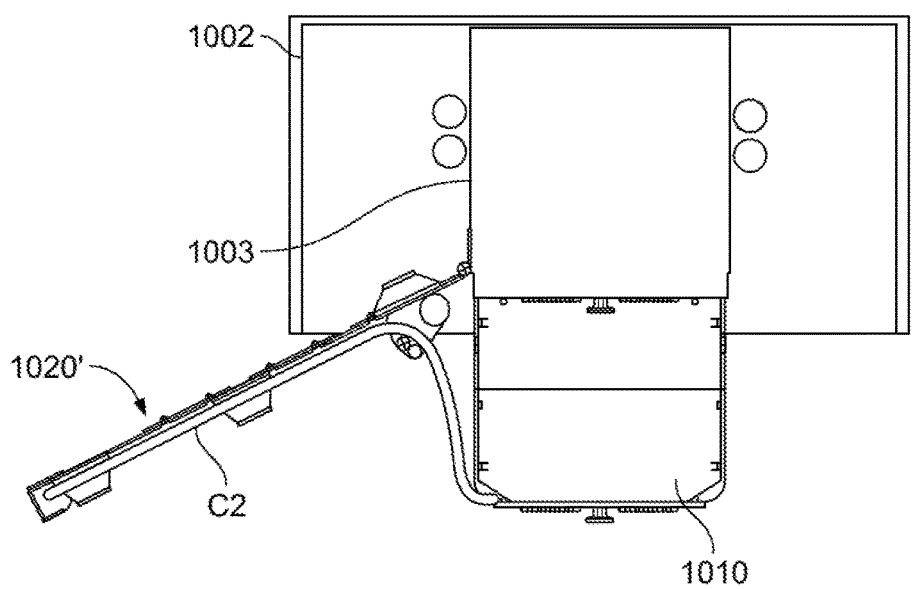

Similar to the hanger plate assembly 1020 of patch panel system 1000, the hanger plate assembly 1020' of patch panel system 1000' has a stored condition, shown in FIGS. 11A-B, a pulled out condition for access as shown in FIGS. 11G-H, with an intermediate position shown in FIGS. 11E-F. A top view of the hanger plate assembly 1020' in the stored condition is shown in FIG. 11C, with inner and outer housings 1002, 1003 omitted for clarity of illustration. Similar to hanger plater assembly 1020, hanger plate assembly 1020' may include a substantially rigid rectangular first hanger plate 1021a' coupled to inner housing 1003 by one or more hinges 1022. A plurality of hangers 1023, identical to those described above, may be coupled to the first hanger plate 1021a' in a vertically stacked configuration. First hanger plate 1021a' may include one or more rear hanger plates 1027 similar or identical to those described above.

First hanger plate 1021a' may have a height similar to the height of hanger plate 1021, but may be narrower. In addition to first hanger plate 1021a', hanger plate assembly 1020' may include a plurality of additional hanger plates hingedly coupled to one another and to first hanger plate 1021a'. In the particular embodiment of hanger plate assembly 1020' shown, five additional hanger plates 1021b'-1021f' are hingedly coupled to one another in series, with hanger plate 1021b' hingedly coupled to first hanger plate 1021a'. Each hanger plate 1021a'-1021f' may have a substantially similar height, and the widths of the plates may be similar or different from one another. Although hanger plates 1021a'-f' are shown as separate members that are coupled to one another by hinges, one or more of the hanger plates 1021a'-f' may be integrally formed with a living hinge between adjacent plates to provide similar functionality.

Hanger plate assembly 1020' is shown in FIG. 11D in an extended or pulled out condition with outer housing 1002 and inner housing 1003 omitted for clarity of illustration. Select ones of the hanger plates 1021a'-1021f' may include cable retainers 1030'. Each cable retainer 1030' may include two extensions, such as a top extension 1031' and a bottom extension 1032'. Top extension 1031' may include a first portion extending away from and substantially orthogonally to the corresponding hanger plate, and a second "L"-shaped portion extending down from and orthogonal to the first portion and parallel to the corresponding hanger plate. The bottom extension 1032' may include a first portion extending away from and substantially orthogonally to the corresponding hanger plate, and a second "L"-shaped portion extending up from and orthogonal to the first portion and parallel to the corresponding hanger plate. With this configuration, each extension may form a generally "U"-shaped channel. The two "L"-shaped portions of the top extension 1031' and the bottom extension 1032' may be positioned with respect to one another so that they form a rectangular shape with a gap between the "L"-shaped portions adapted to receive cable C2 therethrough and into one or both of the "U"-shaped channels. As shown in FIG. 11D, two cable retainers 1030' may be positioned toward the top of an intermediate hanger plate 1021d' and an end hanger plate 1021f', with two cable retainers 1030' positioned toward the bottom of hanger plates 1021d' and 1021f'. It should be understood that more or fewer cable retainers 1030' than shown may be used with hanger plate assembly 1020'.

Cables C2 coupled to the front of a cassette 1010 may first pass through a corresponding hanger 1023 in the same fashion as described in connection with FIGS. 10A-H. Cables C2 may then extend along the sequence of hanger plates and into one or both of the "U"-shaped channels formed by a cable retainer 1030' on one of the intermediate hanger plates, such as hanger plate 1021d'. The cables C2 may continue to extend to the cable retainer 1030' on the end hanger plate 1021f', at which point the cables C2 may extend up or down to the cable retainers 1030' on the opposite end of the hanger plates. The end hanger plate 1021f' may include an end portion 1040' that forms a "U"-shape channel along substantially the entire height of the hanger plate 1021f'. End portion 1040' may receive cables C2 that pass from the top cable retainer 1030' on hanger plate 1021f' and to the bottom cable retainer 1030' on hanger plate 1021f'. End portion 1040' may ensure that cables C2 stay in place as they switch directions and provide additional protection. End portion 1040' may also be used as a handle for a user to grasp to pull the hanger plate assembly 1020' out of outer housing 1002.

In the completely stored position, as shown in FIGS. 11A-B, the hanger plates 1021a'-1021f' may collapse with respect to one another to form a "U"-shape that fits completely within outer housing 1002 between one side wall of inner housing 1003 and the corresponding side wall of outer housing 1002. If a user needs to access cassettes 1010 and cables C2 for maintenance, the user may pull hanger plate assembly 1020' out of outer housing 1002. As the user pulls hanger plate assembly 1020' proximally, the hinges between adjacent hanger plates 1021a'-1021f' allow the hanger plate assembly 1020' to begin to straighten and extend out of the outer housing 1002. As the user continues to pull hanger plate assembly 1020', it transitions into a fully extended configuration as shown in FIGS. 11G-H, where all of the hanger plates 1021a'-1021f' are substantially straight with respect to one another. In this configuration, the user may then pull out one or more cassettes 1010 as desired to perform maintenance on cables C2 as desired. The position of the retaining members 1025, 1026 and the guide surface 1024 with respect to the maximum distance that the cassettes 1010 may slide may be based on the same or similar considerations as described above in connection with FIGS. 10I-J.

Compared to hanger plate assembly 1020, hanger plate assembly 1020' may provide an increased effective length along which cable C2 may extend, despite the same amount of space being available between the walls of inner housing 1003 and outer housing 1002. As noted above, if cables C2 are stiff, the additional length provided by hanger plate assembly 1020' may make the cables C2 more easily and safely stored and maintained. Although cable retainers 1030' are shown as having particular structure, number, and relative positioning, it should be understood that other forms of cable retainers may be suitable. For example, any structure that provides support for the cables C2 as they run along the hanger plates 1021a'-1021f', particularly those that allow for the cables C2 to be inserted into or removed from the retainers with intentional effort, but to keep the cables from exiting unintentionally, may be suitable alternates to the disclosed embodiment.

Figure 12:
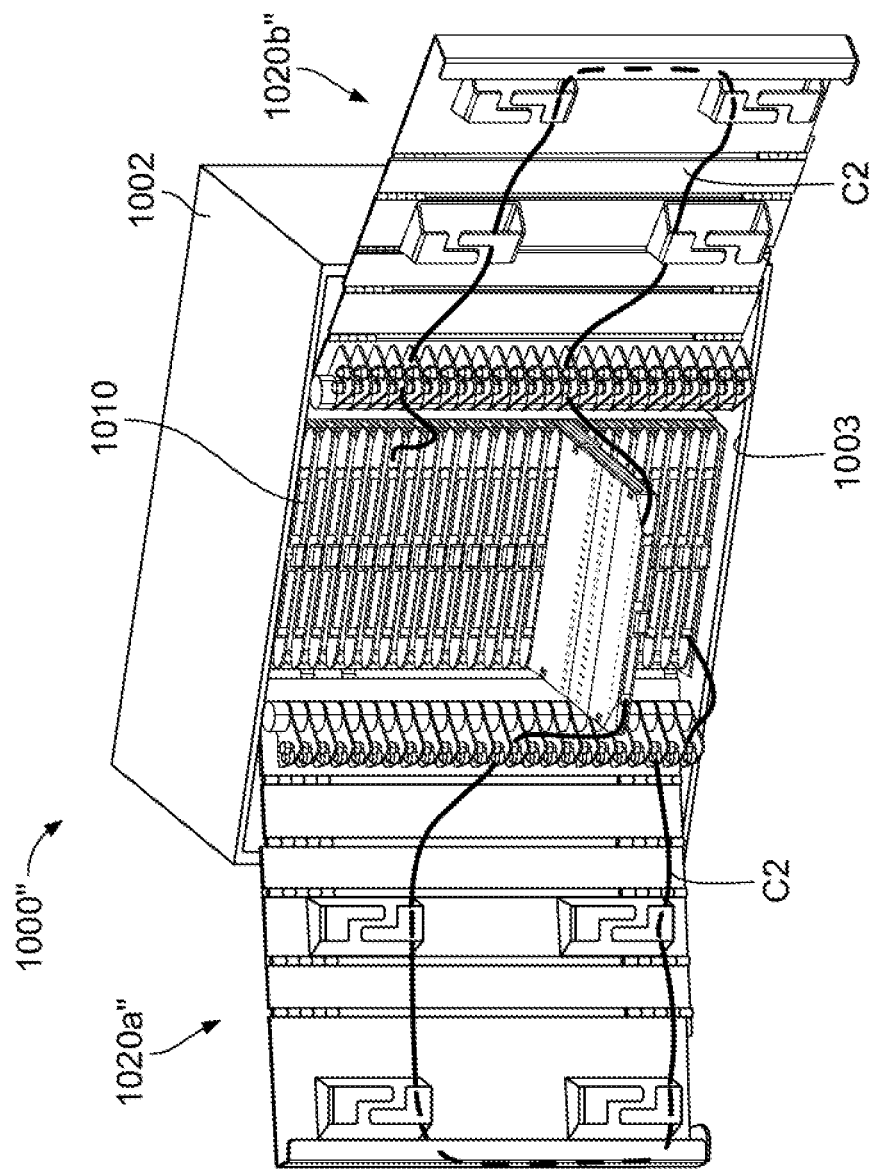
FIG. 12 is perspective view of an alternate patch panel system with two hanger plate assemblies in a pulled out condition.

Although patch panel system 1000' is shown with a single hanger plate assembly 1020, it should be understood that two hanger plate assemblies may be used. An example of this is shown in FIG. 12, where patch panel system 1000" is identical to patch panel system 1000' in all respects with the exception of the number of hanger plate assemblies. Hanger plate assembly 1020a" may be identical to hanger plate assembly 1020' in structure and function. A second hanger plate assembly 1020b", which may be an identical but mirror configuration of hanger plate assembly 1020a", may be coupled to right wall of inner housing 1003. The additional hanger plate assembly 1020b" may provide for additional management of cables C2, particularly those coupled to near the right side of the front of cassettes 1010.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A communication system, comprising:
    a housing;
    a tray having a plurality of ports each having a front face connectable to a cable, the tray movably engaged with the housing so that the tray may slide along a proximal-to-distal axis with respect to the housing, the tray being slideable between a first distal-most position substantially inside the housing and a second proximal-most position substantially outside the housing; and
    a cable guide for supporting at least one of the plurality of cables, the cable guide having an operable position with respect to the housing,
    wherein, in the first distal-most position, the front faces of the ports are positioned distal to the operable position of the cable guide a first distance from the cable guide and, in the second proximal-most position, the front faces of the ports are positioned proximal to the operable position of the cable guide a second distance from the cable guide, the second distance being less than the first distance.

2. The communication system of claim 1, wherein the cable guide is rotatable with respect to the housing from a stored position to the operable position.

3. The communication system of claim 1, wherein the cable guide has a fixed position relative to the housing, the fixed position being the operable position.

4. The communication system of claim 3, wherein the cable guide further comprises a mounting arm configured for fixing to the housing.

5. The communication system of claim 3, wherein the cable guide has a plurality of shelves arranged vertically, each shelf having a first end and a second free end spaced apart from the first end.

6. The communication system of claim 5, wherein the first end of a first shelf is connected to the first end of a second shelf by a convex surface, the first and second shelves being vertically adjacent to one another.

7. The communication system of claim 5, wherein the cable guide further comprises a first fin extending from the second free end of a first shelf toward a second shelf, the first and second shelves being vertically adjacent to one another.

8. The communication system of claim 7, wherein the cable guide further comprises a second fin extending from the second free end of the second shelf toward the first shelf, the first and second fins defining an opening therebetween.

9. The communication system of claim 7, wherein the first fin extends substantially orthogonally from the first shelf.

10. The communication system of claim 5, wherein the cable guide further comprises a strap fastener coupled to one of the plurality of shelves, the strap fastener having a first free end and a second free end releasably attachable to the first free end.

11. The communication system of claim 10, wherein the first free end of the strap fastener is coupled to the one shelf with a bolt or rivet extending through a first aperture in the strap and a second corresponding aperture in the one shelf.

12. The communication system of claim 5, wherein a plurality of the trays is arranged vertically, a pair of vertically adjacent trays being spaced apart by a first vertical distance, and a pair of vertically adjacent shelves being spaced apart by a second distance substantially equal to the first distance.

13. The communication system of claim 1,
wherein, when the system is in a state in which a first cable is connected at one end to one of the ports and supported by the cable guide at a portion of the first cable a predetermined length of the first cable from the one end, the first cable has a first slack when the tray is in the first distal-most position, a second slack when the tray is in the second proximal-most position, and a third slack when the tray is in a third position intermediate the first and second positions, the third slack being greater than the first slack and the second slack.

14. The communication system of claim 1, the tray being adapted to slide a first distance in a first direction from the first distal-most position to the second proximal-most position, wherein the cable guide in the operable position is positioned a second distance in the first direction from the front faces of the plurality of ports when the tray is in the first distal-most position, the first distance being less than double the second distance.

15. The communication system of claim 1, wherein the tray is a head of a cassette and the housing is a housing of the cassette, the tray including at least two rails adapted to slide into and out of corresponding rail slots defined by the cassette housing.

16. The communication system of claim 15, further comprising a chassis adapted to retain a plurality of cassettes.

17. The communication system of claim 16, wherein the cable guide is fixed to the chassis in the operable position.

18. The communication system of claim 16, wherein the cable guide is fixed to the housing of one of the plurality of cassettes in the operable position.

19. A communication system comprising:
a housing;
a tray having a plurality of ports each having a front face connectable to a cable, the tray movably engaged with the housing and having a first position substantially inside the housing and a second position substantially outside the housing; and
a cable guide for supporting at least one of the plurality of cables, the cable guide having an operable position with respect to the housing,
wherein, when the system is in a state in which the cable guide is in the operable position and a first cable is connected at one end to one of the ports and supported by the cable guide at a portion of the first cable a predetermined length of the first cable from the one end, the first cable has a first slack when the tray is in the first position, a second slack when the tray is in the second position, and a third slack when the tray is in a third position intermediate the first and second positions, the third slack being greater than the first slack and the second slack.

20. The communication system of claim 19, wherein the cable guide is rotatable with respect to the housing from a stored position to the operable position.

21. The communication system of claim 19, wherein the cable guide has a fixed position relative to the housing, the fixed position being the operable position.

22. The communication system of claim 21, wherein the cable guide includes a mounting arm configured for fixing to the housing.

23. The communication system of claim 22, wherein the cable guide includes a shelving unit adapted to removably couple to the mounting arm.

* * * * *